(12) United States Patent
Manda et al.

(10) Patent No.: US 11,476,285 B2
(45) Date of Patent: Oct. 18, 2022

(54) LIGHT-RECEIVING DEVICE, IMAGING DEVICE, AND ELECTRONIC APPARATUS

(71) Applicant: SONY SEMICONDUCTOR SOLUTIONS CORPORATION, Kanagawa (JP)

(72) Inventors: Shuji Manda, Kanagawa (JP); Tomoyuki Hirano, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 269 days.

(21) Appl. No.: 16/462,868

(22) PCT Filed: Nov. 17, 2017

(86) PCT No.: PCT/JP2017/041435
§ 371 (c)(1),
(2) Date: May 21, 2019

(87) PCT Pub. No.: WO2018/105359
PCT Pub. Date: Jun. 14, 2018

(65) Prior Publication Data
US 2021/0183924 A1    Jun. 17, 2021

(30) Foreign Application Priority Data
Dec. 7, 2016    (JP) .............................. JP2016-237296

(51) Int. Cl.
*H01L 27/146*    (2006.01)

(52) U.S. Cl.
CPC .... *H01L 27/14607* (2013.01); *H01L 27/1463* (2013.01); *H01L 27/1464* (2013.01);
(Continued)

(58) Field of Classification Search
CPC ......... H01L 27/14607; H01L 27/14623; H01L 27/14649; H01L 27/14689;
(Continued)

(56) References Cited

U.S. PATENT DOCUMENTS 6,011,271 A * 1/2000 Sakuma ............ H01L 21/02543
257/14
6,177,710 B1 * 1/2001 Nishikata ........ H01L 31/035281
257/E31.038
(Continued)

FOREIGN PATENT DOCUMENTS

| CN | 104393008 | 3/2015 |
| JP | 2014-127499 | 7/2014 |

(Continued)

OTHER PUBLICATIONS

Official Action (no English translation available) for Japanese Patent Application No. 2016-237296, dated Oct. 20, 2020, 4 pages.
(Continued)

*Primary Examiner* — Jarrett J Stark
(74) *Attorney, Agent, or Firm* — Sheridan Ross P.C.

(57) ABSTRACT

A light-receiving device includes at least one pixel. The at least one pixel includes a first electrode; a second electrode; and a photoelectric conversion layer between the first electrode and the second electrode. The photoelectric conversion layer is configured to convert incident infrared light into electric charge. The photoelectric conversion layer has a first section and a second section. The first section is closer to the first electrode than the second section, and the second section is closer to the second electrode than the first section. At least one of the first section and the second section have a plurality of surfaces.

18 Claims, 20 Drawing Sheets

(52) U.S. Cl.
CPC .. *H01L 27/14623* (2013.01); *H01L 27/14627* (2013.01); *H01L 27/14636* (2013.01); *H01L 27/14649* (2013.01); *H01L 27/14689* (2013.01); *H01L 27/14694* (2013.01)

(58) Field of Classification Search
CPC ........... H01L 27/14636; H01L 27/1464; H01L 27/14627; H01L 27/14694; H01L 27/1463
See application file for complete search history.

(56) References Cited

U.S. PATENT DOCUMENTS

| | | | |
|---|---|---|---|
| 6,207,890 B1* | 3/2001 | Nakai | H01L 31/03529 136/246 |
| 6,380,604 B1* | 4/2002 | Shima | H01L 31/035281 257/466 |
| 7,928,389 B1 | 4/2011 | Yap et al. | |
| 8,846,432 B2* | 9/2014 | Jones | H01L 31/101 438/66 |
| 9,369,681 B1* | 6/2016 | Wu | H01L 27/14627 |
| 9,620,360 B1* | 4/2017 | Borg | H01L 29/0692 |
| 2002/0020892 A1* | 2/2002 | Shima | B82Y 10/00 257/14 |
| 2004/0173863 A1 | 9/2004 | Gidon et al. | |
| 2005/0205954 A1* | 9/2005 | King | H01L 27/14649 257/466 |
| 2006/0181603 A1* | 8/2006 | Ogura | B41J 2/451 347/238 |
| 2008/0073743 A1* | 3/2008 | Alizadeh | H01L 31/18 438/93 |
| 2008/0211047 A1 | 9/2008 | Iida | |
| 2008/0257409 A1* | 10/2008 | Li | H01L 31/047 136/259 |
| 2009/0008687 A1* | 1/2009 | Katsuno | H01L 27/14627 257/292 |
| 2009/0057659 A1* | 3/2009 | Maehara | H01L 51/4213 257/E51.012 |
| 2009/0078856 A1* | 3/2009 | Kawamura | H01L 27/14603 250/214 R |
| 2009/0078877 A1* | 3/2009 | Yaegashi | G01T 1/2018 250/370.08 |
| 2009/0085136 A1* | 4/2009 | Lee | H01L 27/14685 257/432 |
| 2010/0315536 A1* | 12/2010 | Wang | H04N 9/04515 348/E5.051 |
| 2011/0139253 A1* | 6/2011 | Wachi | H01L 51/442 136/263 |
| 2011/0226934 A1* | 9/2011 | Tian | H01L 27/14609 257/E31.127 |
| 2011/0259409 A1* | 10/2011 | Naito | H01L 51/4273 136/255 |
| 2012/0080726 A1* | 4/2012 | Sakano | H01L 27/14612 438/57 |
| 2012/0193608 A1* | 8/2012 | Forrai | B82Y 20/00 257/14 |
| 2012/0217602 A1* | 8/2012 | Enomoto | H01L 27/14605 257/E31.127 |
| 2012/0313142 A1* | 12/2012 | Suzuki | H01L 27/1461 257/184 |
| 2013/0061915 A1* | 3/2013 | Myong | H01L 31/076 136/255 |
| 2013/0234029 A1* | 9/2013 | Bikumandla | H01L 25/043 257/432 |
| 2013/0288418 A1* | 10/2013 | Wang | H01L 31/18 438/68 |
| 2014/0077060 A1* | 3/2014 | Miyazawa | H01L 27/14685 257/432 |
| 2014/0306360 A1* | 10/2014 | Li | G02B 3/0043 264/1.7 |
| 2015/0061062 A1* | 3/2015 | Lin | H01L 27/1463 438/69 |
| 2015/0109501 A1* | 4/2015 | Sekine | H01L 27/14627 438/69 |
| 2015/0162365 A1* | 6/2015 | Chang | H01L 27/14636 438/70 |
| 2015/0171146 A1* | 6/2015 | Ooki | H01L 27/14605 257/40 |
| 2015/0179693 A1* | 6/2015 | Maruyama | H01L 27/14643 438/66 |
| 2015/0188065 A1* | 7/2015 | Takimoto | H01L 27/1462 257/40 |
| 2015/0236066 A1* | 8/2015 | Tayanaka | H01L 27/14623 438/69 |
| 2015/0263054 A1* | 9/2015 | Chien | H01L 27/14623 257/292 |
| 2015/0364715 A1* | 12/2015 | Yoon | H01L 51/5234 257/40 |
| 2016/0013233 A1* | 1/2016 | Noudo | H01L 27/14623 438/69 |
| 2016/0056196 A1* | 2/2016 | Li | H01L 27/1464 257/435 |
| 2016/0064438 A1* | 3/2016 | Huang | H01L 27/1462 257/435 |
| 2016/0155863 A1* | 6/2016 | Baehr-Jones | H01L 27/14649 438/69 |
| 2016/0190346 A1* | 6/2016 | Kawata | H01J 37/3447 257/43 |
| 2016/0211294 A1* | 7/2016 | Lin | H01L 27/1464 |
| 2016/0211392 A1* | 7/2016 | So | H01L 31/101 |
| 2016/0307942 A1* | 10/2016 | Cheng | H01L 27/14623 |
| 2016/0307952 A1* | 10/2016 | Huang | H01L 21/76856 |
| 2017/0271384 A1* | 9/2017 | Zheng | H01L 27/14623 |
| 2017/0272662 A1* | 9/2017 | Tamaki | H04N 5/3698 |
| 2017/0301805 A1* | 10/2017 | Yamarin | H01L 31/068 |
| 2018/0007324 A1* | 1/2018 | Chen | H04N 5/35563 |
| 2018/0020171 A1* | 1/2018 | Miyake | H04N 5/353 |
| 2018/0040747 A1* | 2/2018 | Matsuyama | H01L 31/202 |
| 2018/0054581 A1* | 2/2018 | Sano | H04N 9/04557 |
| 2018/0151625 A1* | 5/2018 | Hasegawa | H01L 27/286 |
| 2018/0159059 A1* | 6/2018 | Takemura | H01L 31/10 |
| 2018/0182812 A1* | 6/2018 | Heo | H01L 27/307 |
| 2018/0248060 A1* | 8/2018 | Do | H01L 31/202 |
| 2018/0294315 A1* | 10/2018 | Shiomi | H01L 51/441 |
| 2018/0315798 A1* | 11/2018 | Shimasaki | H01L 27/146 |
| 2018/0337292 A1* | 11/2018 | Lee | H01L 31/202 |
| 2018/0342627 A1* | 11/2018 | Hasegawa | H01L 27/14667 |
| 2019/0006399 A1* | 1/2019 | Otake | H01L 27/1464 |
| 2019/0006541 A1* | 1/2019 | So | C30B 29/46 |
| 2019/0052823 A1* | 2/2019 | Jung | H01L 27/14623 |
| 2019/0081251 A1* | 3/2019 | Obana | H01L 51/0073 |
| 2019/0140006 A1* | 5/2019 | Cheng | H01L 27/14689 |
| 2019/0148431 A1* | 5/2019 | Cheng | H01L 27/14621 257/432 |
| 2019/0157323 A1* | 5/2019 | Ogi | H01L 27/14609 |
| 2019/0165026 A1* | 5/2019 | Kuo | H01L 27/1464 |
| 2019/0191067 A1* | 6/2019 | Vaillant | H01L 27/14623 |
| 2019/0214417 A1* | 7/2019 | Matsuo | H01L 27/307 |
| 2019/0245008 A1* | 8/2019 | Lee | H01L 27/14667 |
| 2019/0288040 A1* | 9/2019 | Ujiie | H01L 51/0072 |
| 2019/0312071 A1* | 10/2019 | Yamasaki | H01L 27/14612 |
| 2019/0319055 A1* | 10/2019 | Zaizen | H01L 31/1844 |
| 2019/0371862 A1* | 12/2019 | Muroyama | H01L 51/0053 |
| 2019/0371863 A1* | 12/2019 | Hasegawa | H04N 5/361 |
| 2019/0388042 A1* | 12/2019 | Zhao | H01L 27/14676 |
| 2020/0013822 A1* | 1/2020 | Okumura | H01L 27/14649 |
| 2020/0083263 A1* | 3/2020 | Tanaka | H01L 27/1464 |
| 2020/0099003 A1* | 3/2020 | Ujiie | H01L 51/442 |
| 2020/0144320 A1* | 5/2020 | Seo | H01L 27/14623 |
| 2020/0251512 A1* | 8/2020 | Im | H01L 27/14623 |
| 2020/0258922 A1* | 8/2020 | Kim | H01L 27/14685 |
| 2020/0295287 A1* | 9/2020 | Yajima | H01L 51/0007 |
| 2020/0312913 A1* | 10/2020 | Yajima | H01L 51/442 |
| 2020/0313010 A1* | 10/2020 | Nanba | H01L 31/022425 |
| 2021/0050468 A1* | 2/2021 | Shi | H01L 31/0324 |
| 2021/0074744 A1* | 3/2021 | Sumida | H01L 27/14643 |
| 2021/0111291 A1* | 4/2021 | Fukaya | H01L 31/07 |
| 2021/0118930 A1* | 4/2021 | Noudo | H01L 27/14605 |
| 2021/0242416 A1* | 8/2021 | Sumida | C09K 11/06 |
| 2021/0313531 A1* | 10/2021 | Yamaguchi | H01L 51/426 |

(56) References Cited

U.S. PATENT DOCUMENTS

2021/0391505 A1* 12/2021 Uchida ................... H01L 33/42
2022/0028913 A1* 1/2022 Tateishi ................ G01S 17/931
2022/0085111 A1* 3/2022 Yajima ................... H01L 27/30

FOREIGN PATENT DOCUMENTS

| JP | 2015-149422 | 8/2015 |
| JP | 2016-092091 | 5/2016 |
| JP | 2016-100347 | 5/2016 |
| KR | 10-2010-0064555 | 6/2010 |
| WO | WO 2012/132760 | 10/2012 |
| WO | WO-2012132758 A1 | 10/2012 |

OTHER PUBLICATIONS

Official Action (no English translation available) for Japan Patent Application No. 2016-237296, dated Jan. 5, 2021, 5 pages.
International Search Report and Written Opinion prepared by the European Patent Office dated Jan. 31, 2018, for International Application No. PCT/JP2017/041435.

* cited by examiner

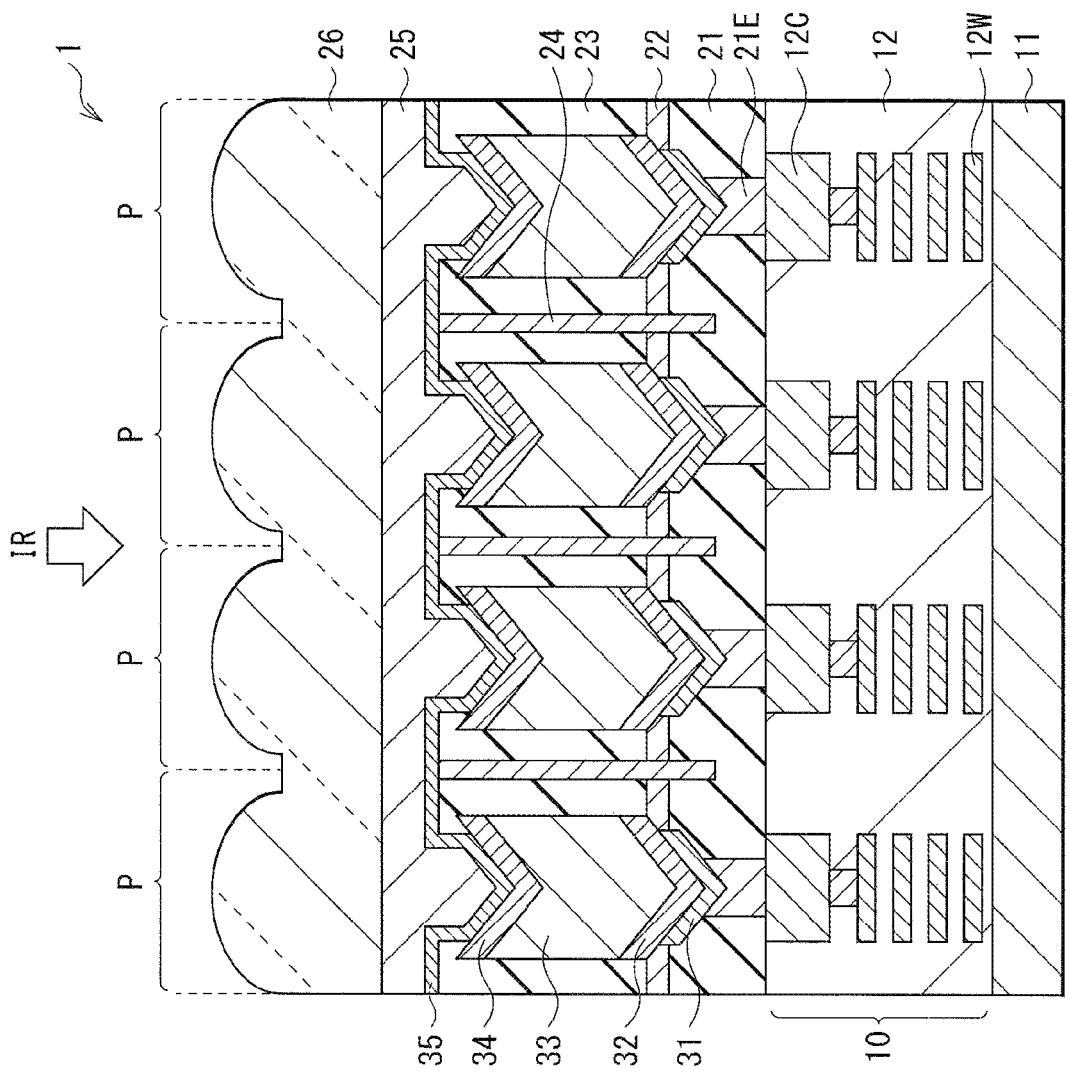
[FIG. 1]

[FIG. 2]
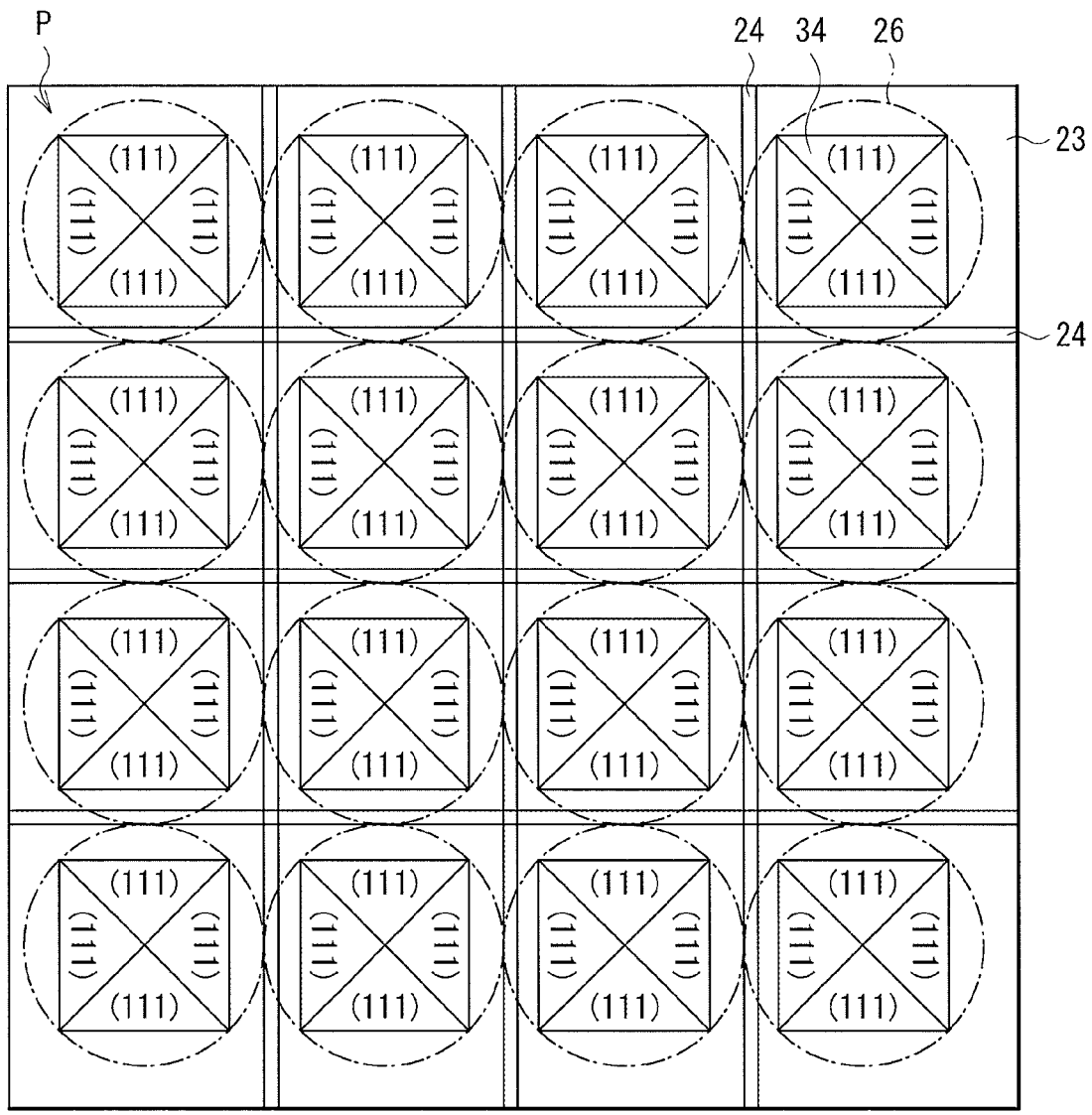
[FIG. 3]
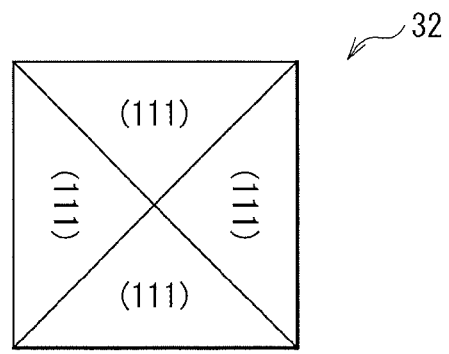

[ FIG. 4A ]
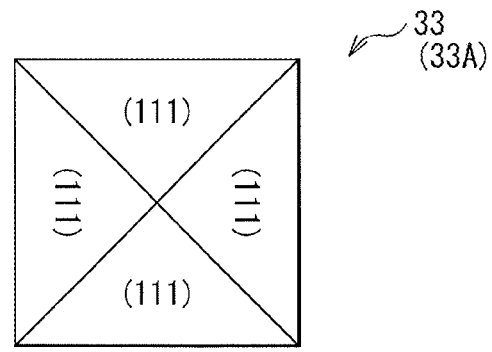
[ FIG. 4B ]
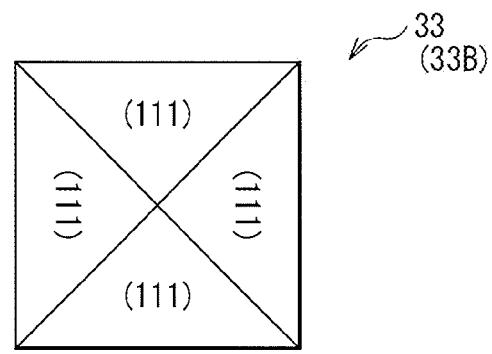
[ FIG. 5 ]
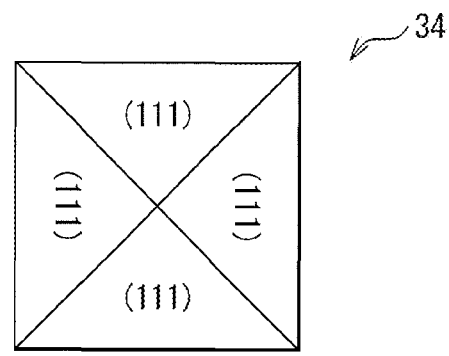

[ FIG. 6A ]
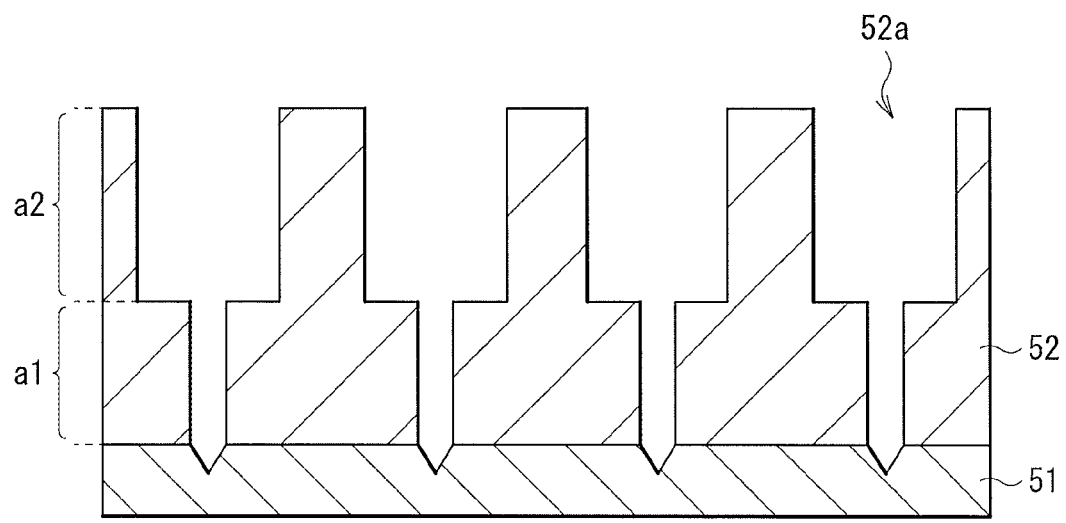
[ FIG. 6B ]
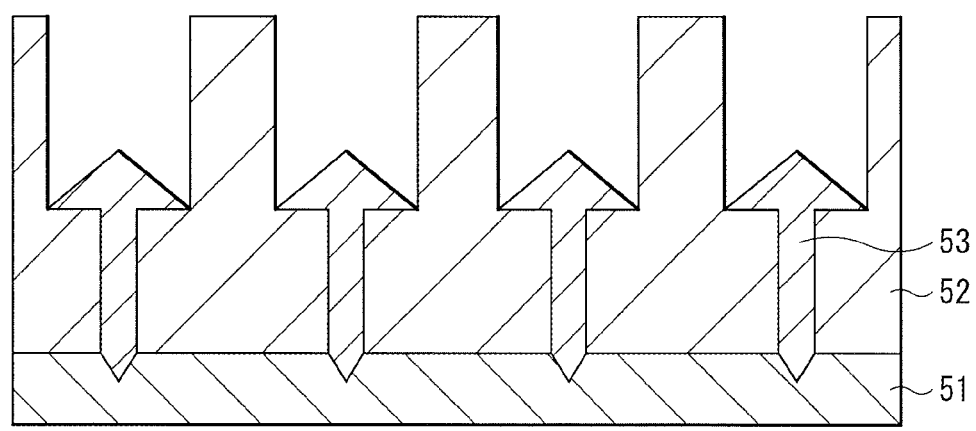

[ FIG. 6C ]
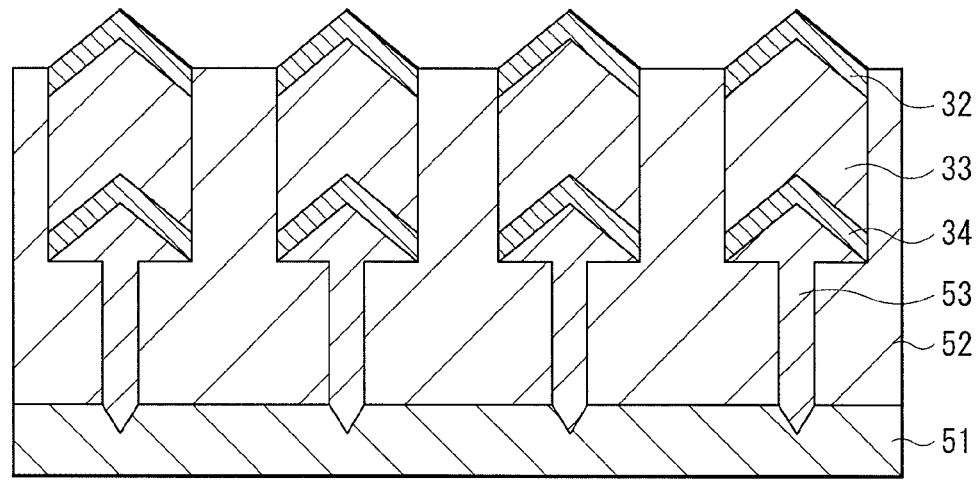
[ FIG. 6D ]
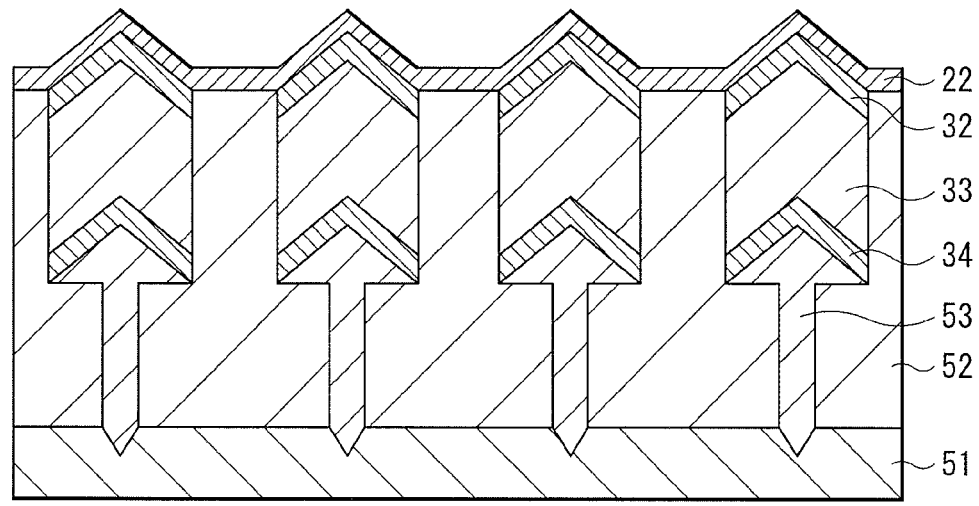

[ FIG. 7A ]
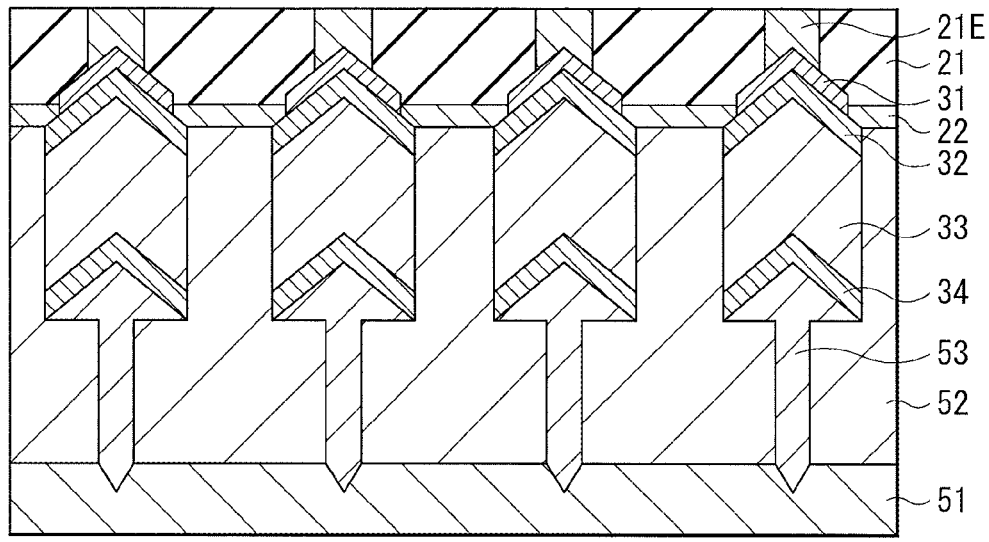
[ FIG. 7B ]
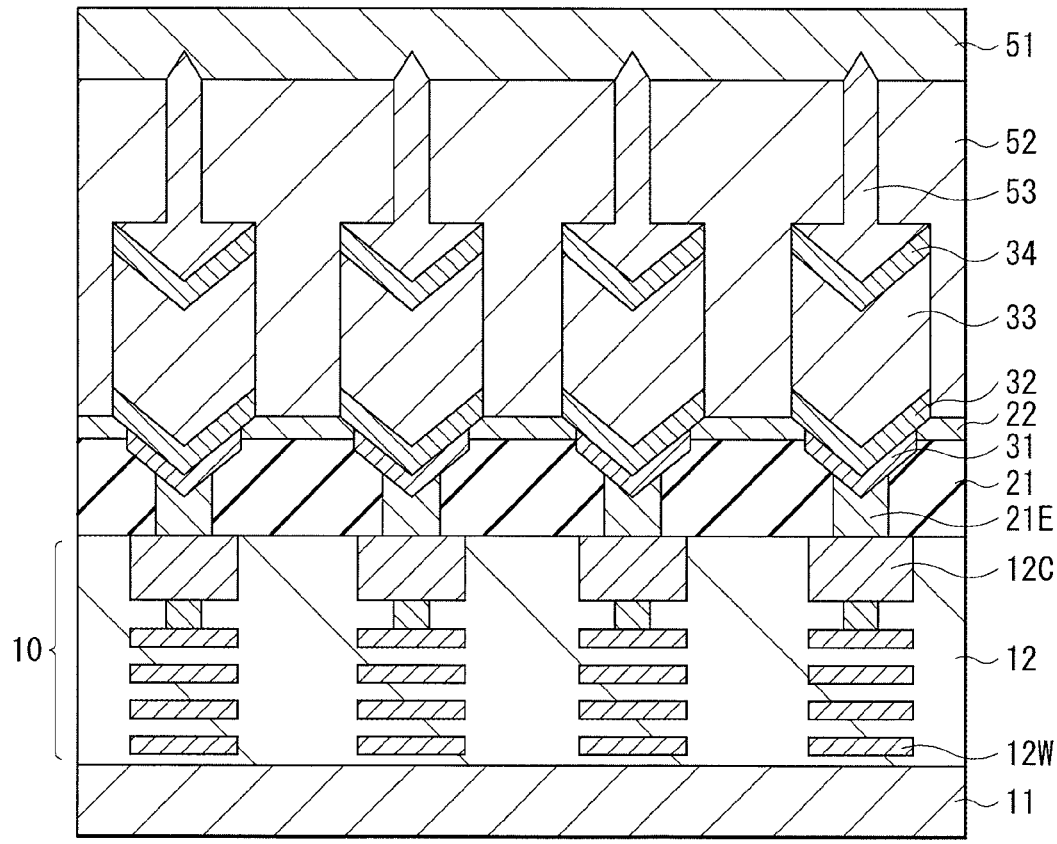

[ FIG. 7C ]
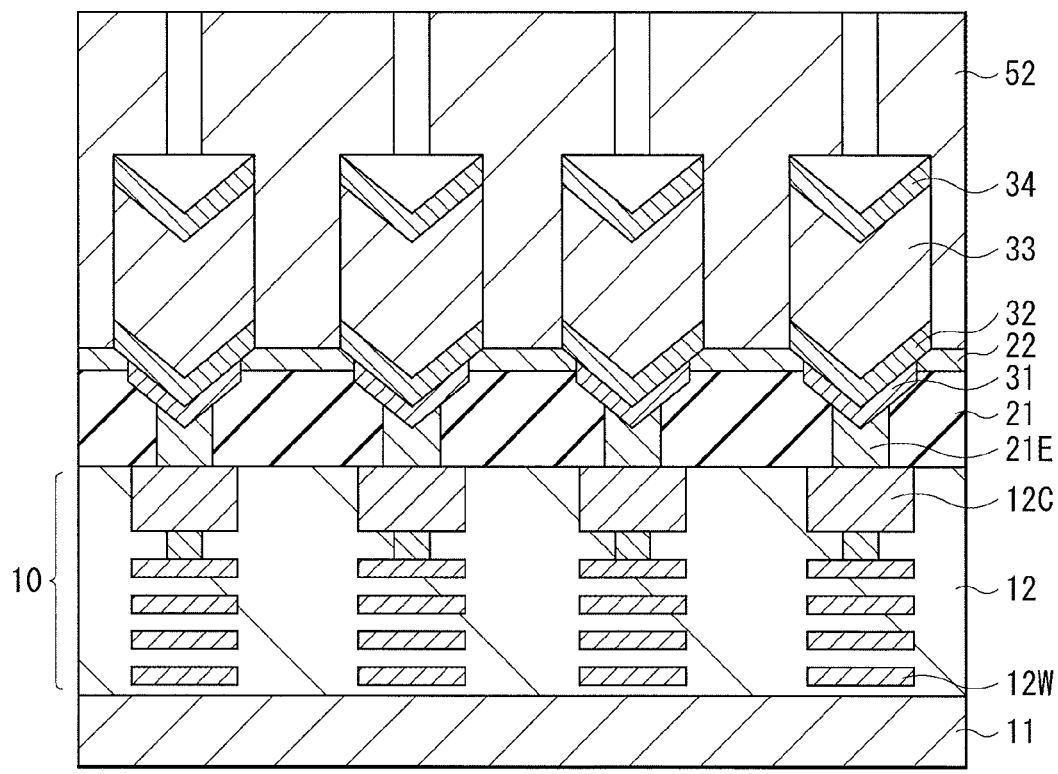
[ FIG. 7D ]
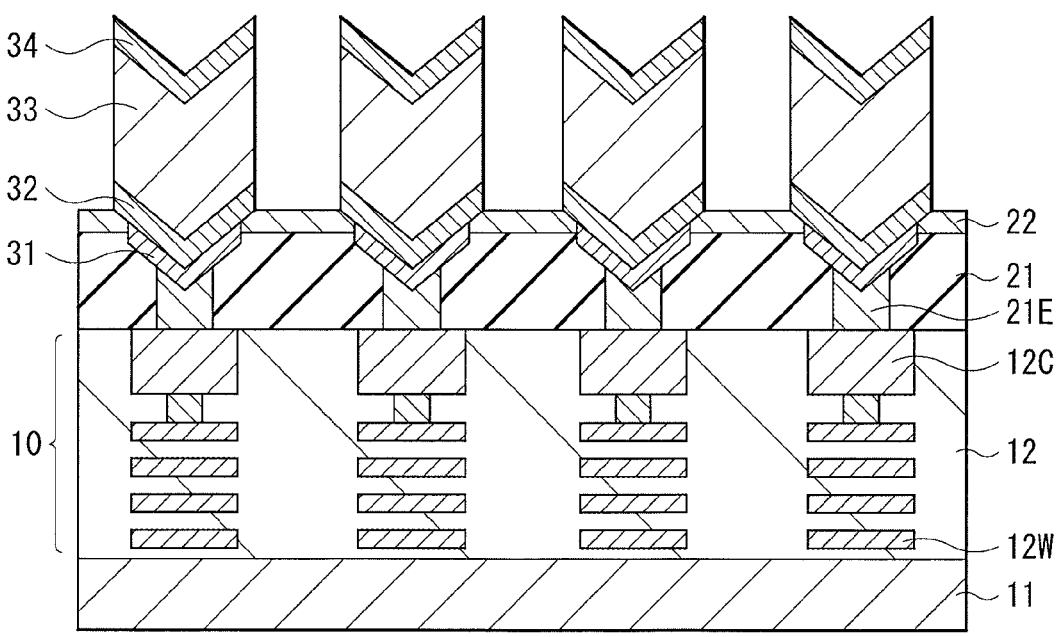

[ FIG. 8A ]
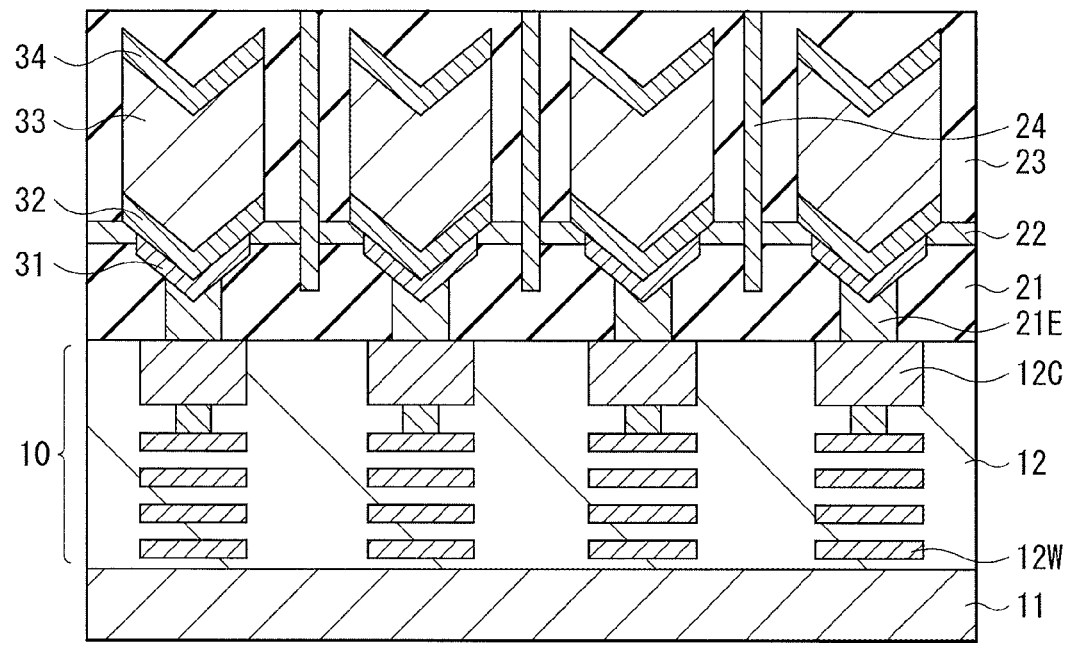
[ FIG. 8B ]
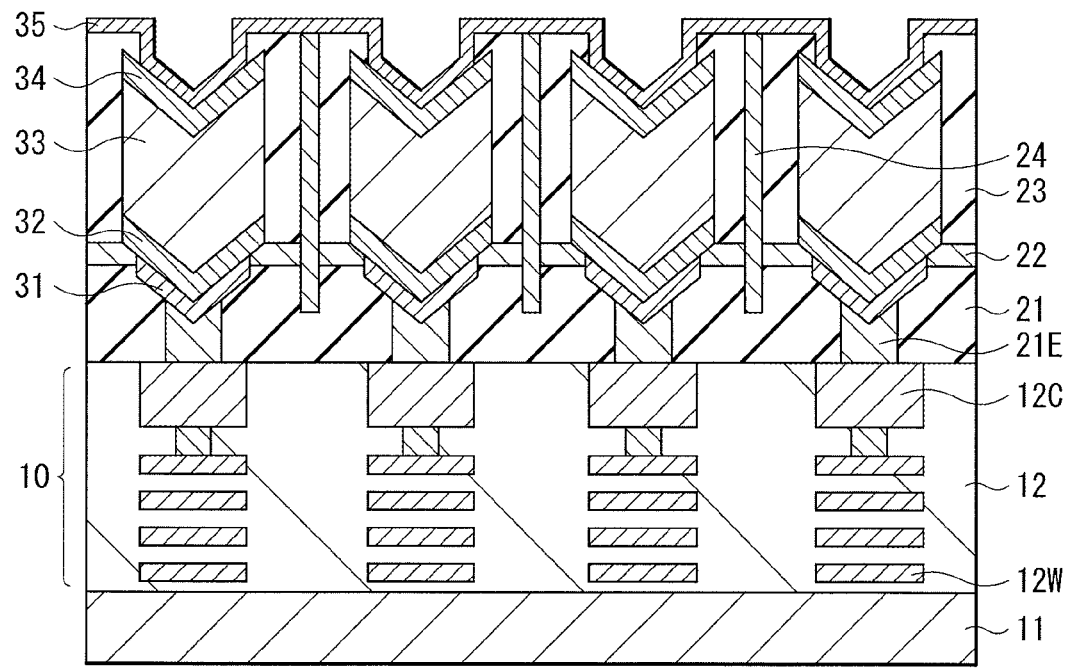

[ FIG. 9A ]
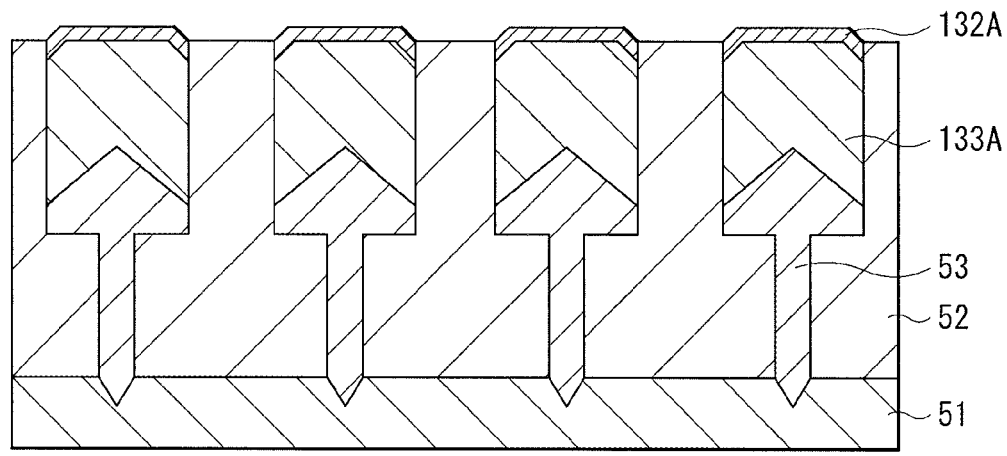
[ FIG. 9B ]
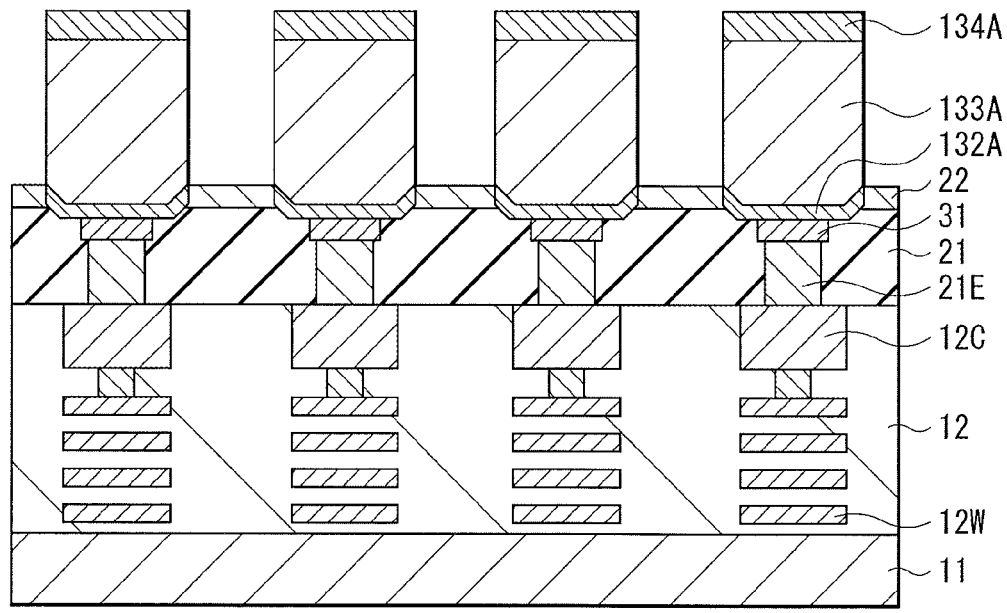

[ FIG. 10 ]
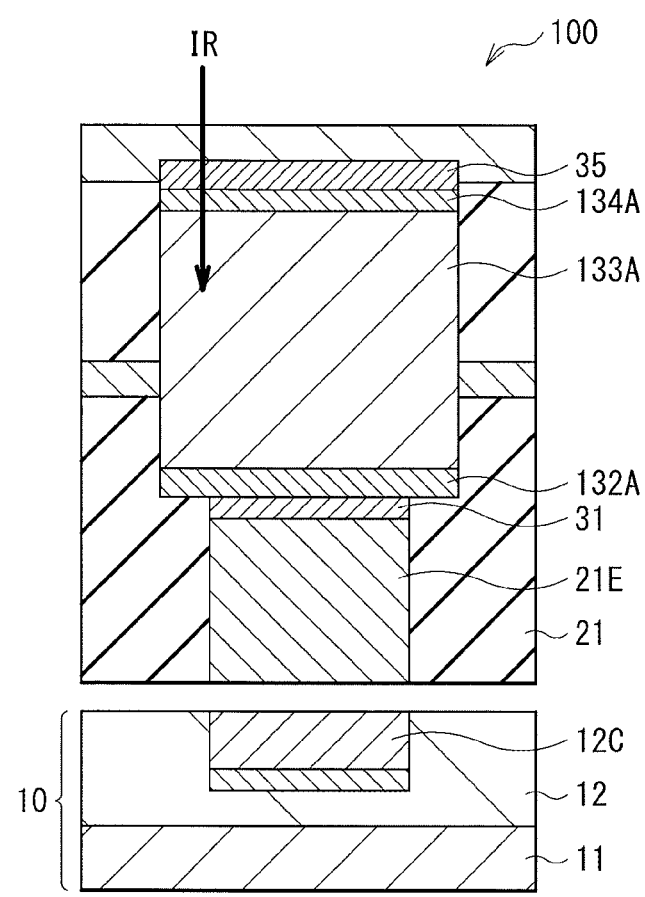

[ FIG. 11A ]
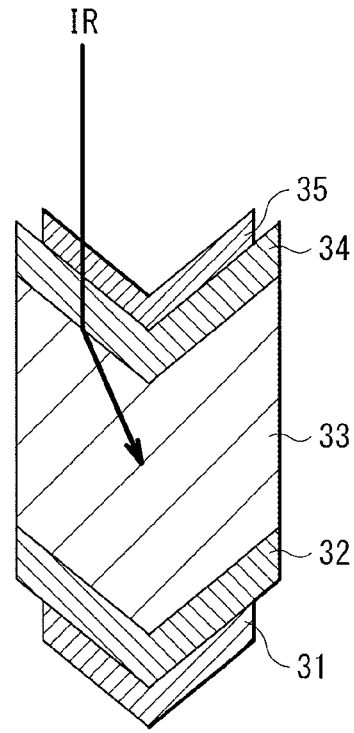
[ FIG. 11B ]
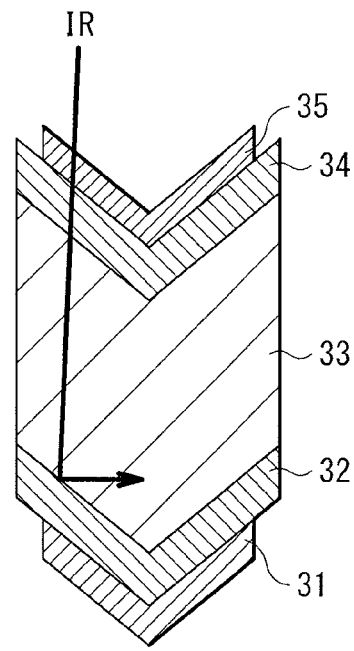

[ FIG. 12 ]
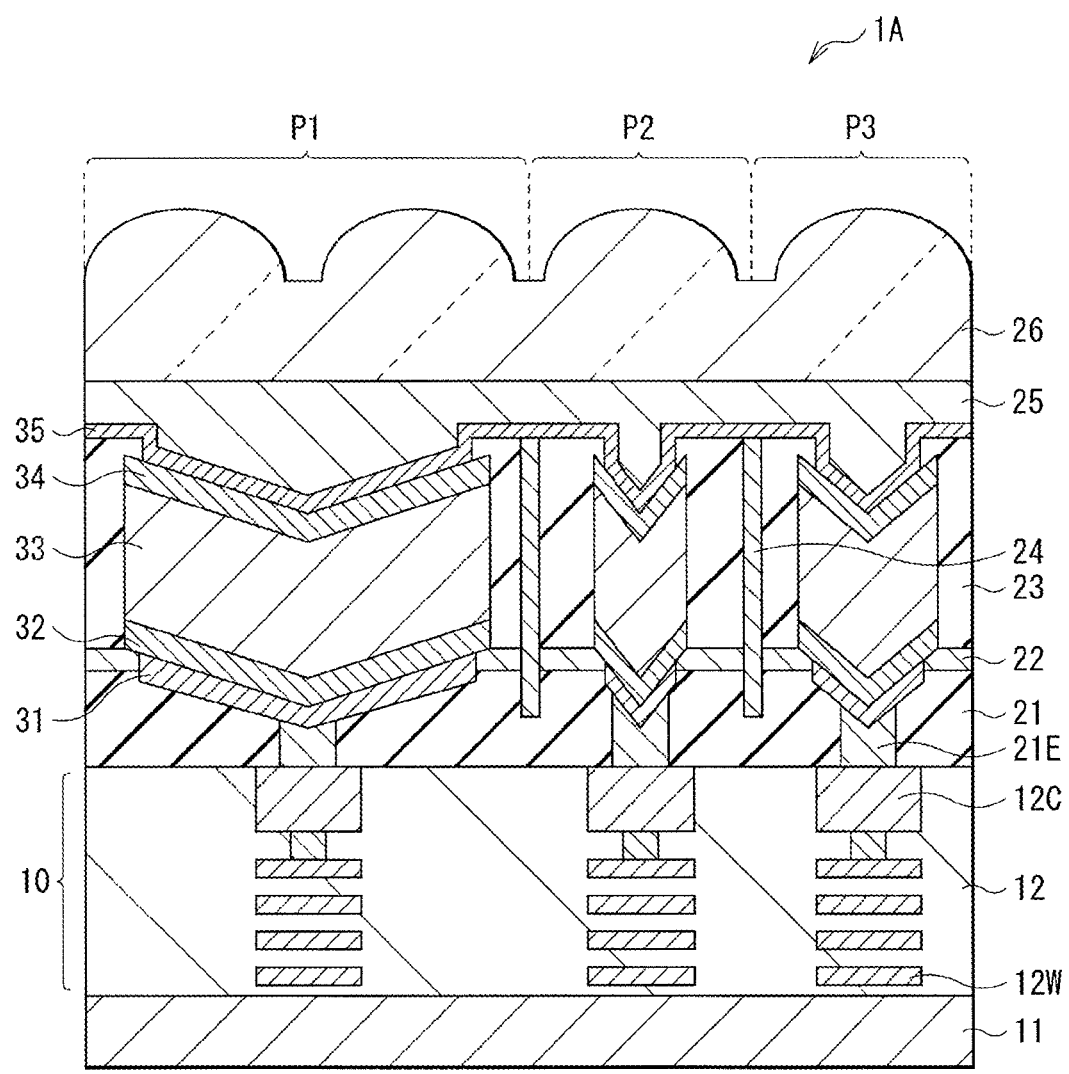

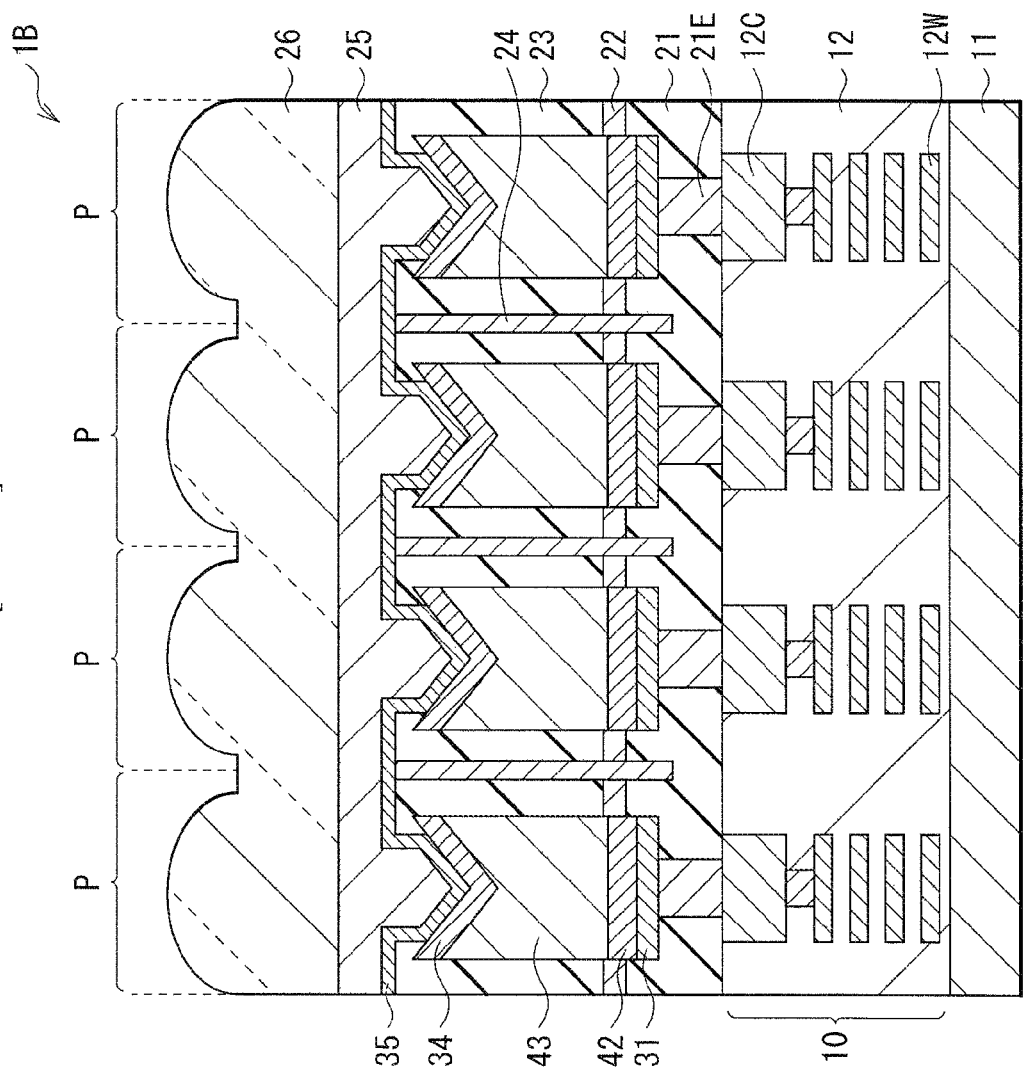
[FIG. 13]

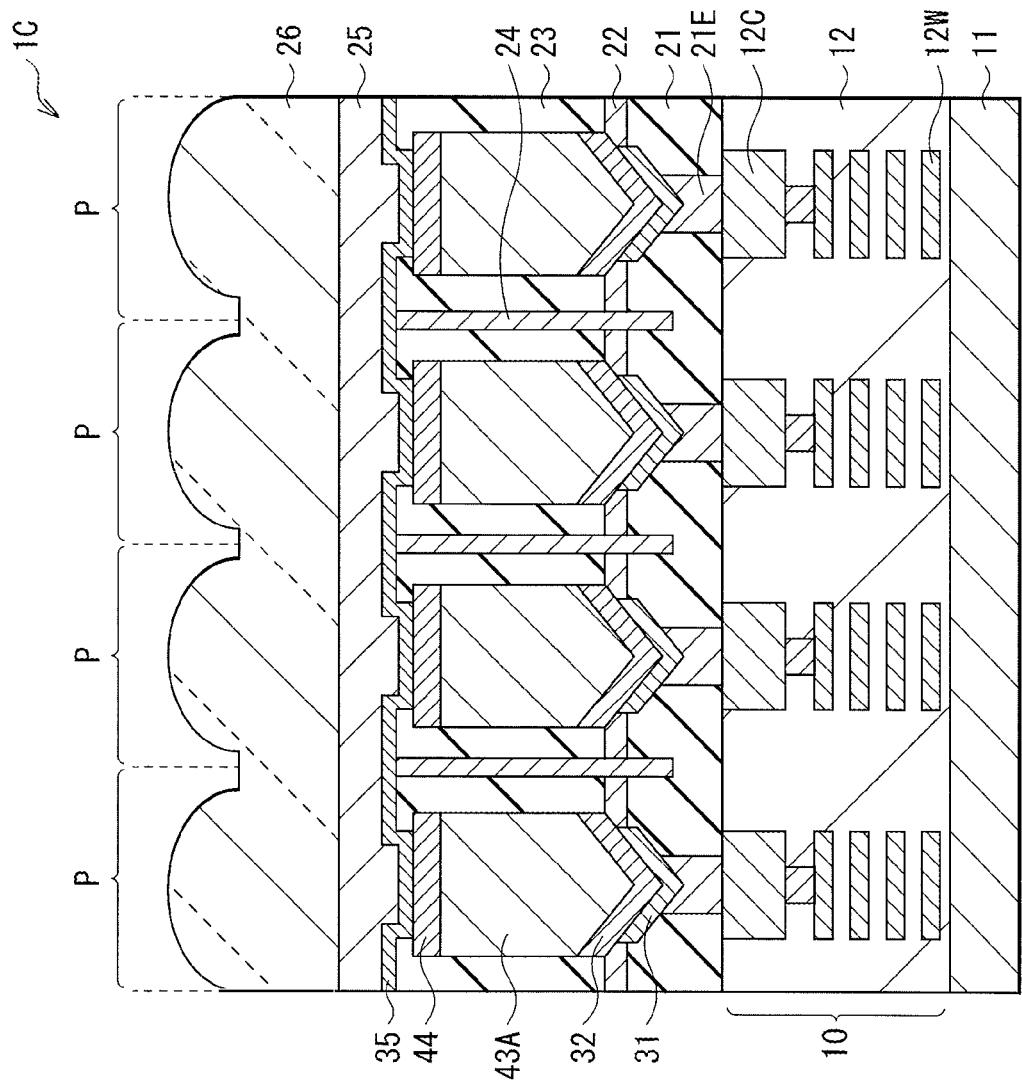
[FIG. 14]

[ FIG. 15 ]
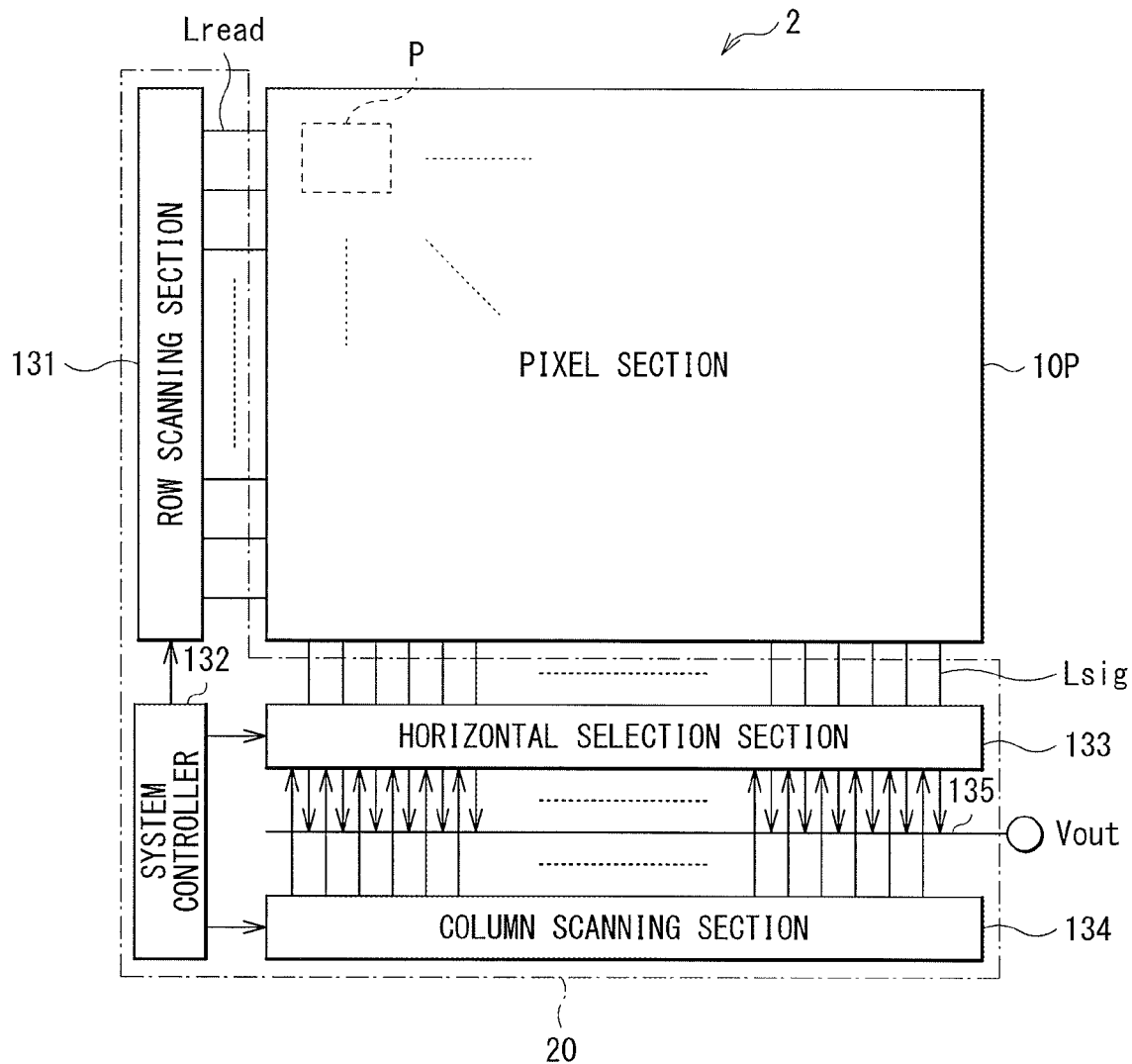
[ FIG. 16 ]
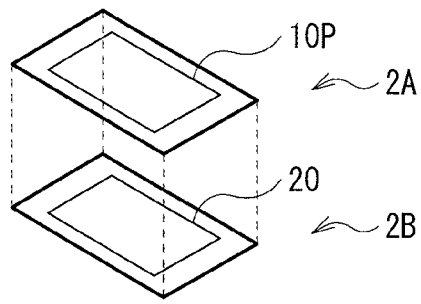

[ FIG. 17 ]
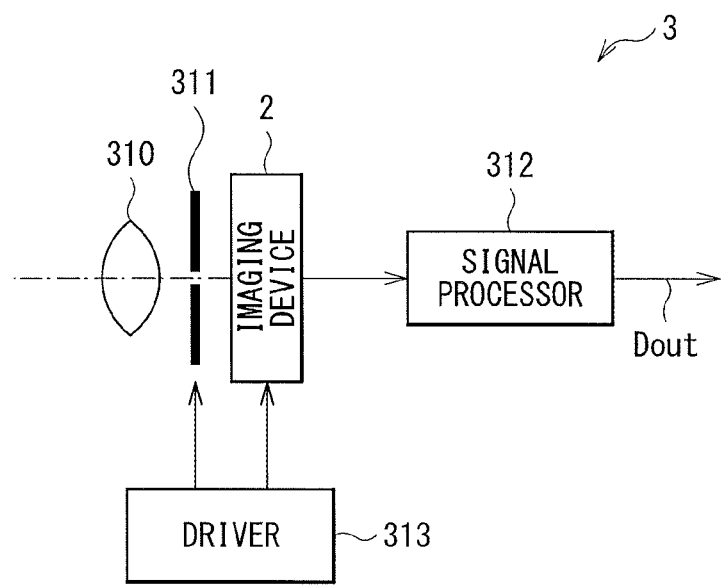

[FIG. 18]
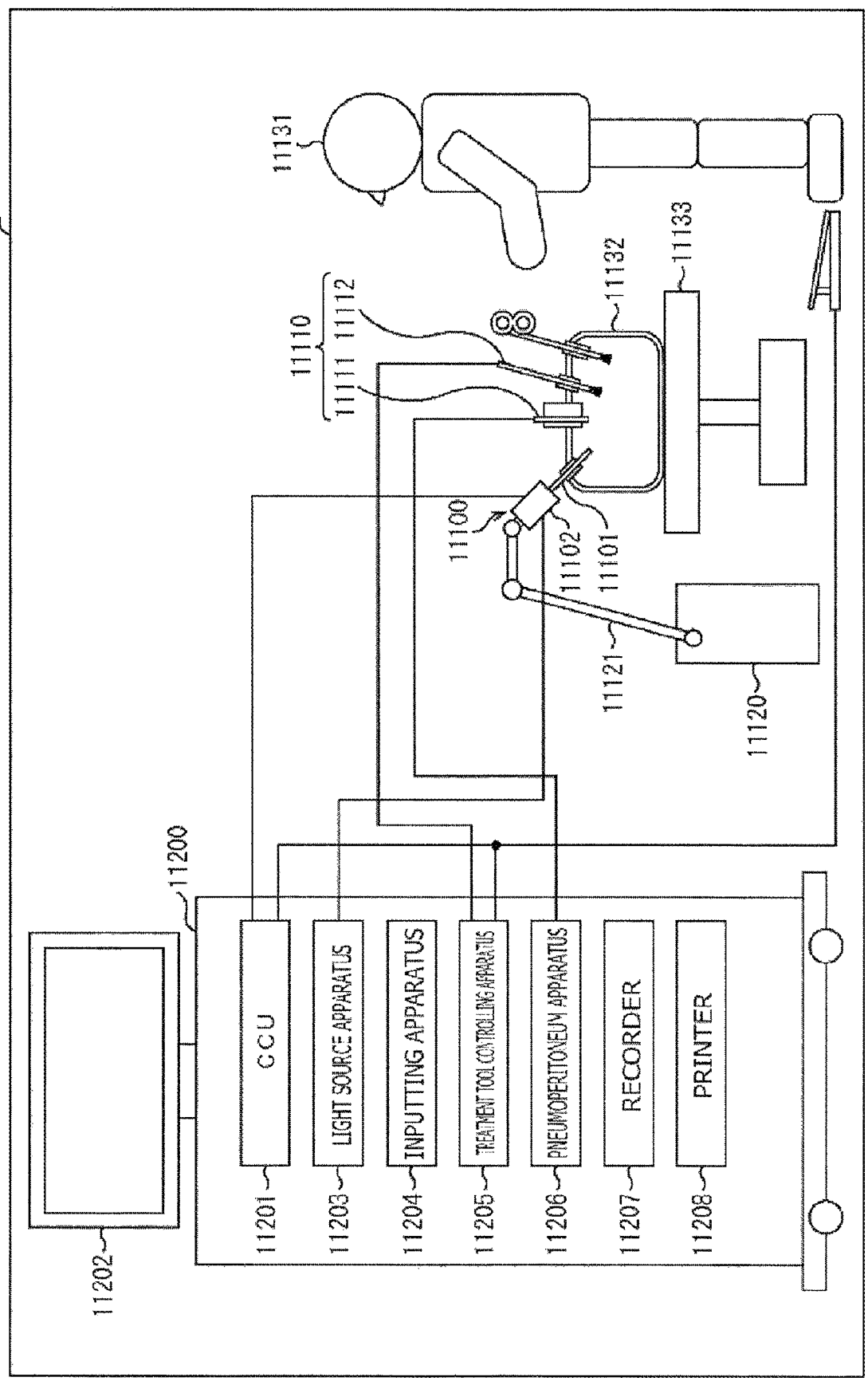

[ FIG. 19 ]
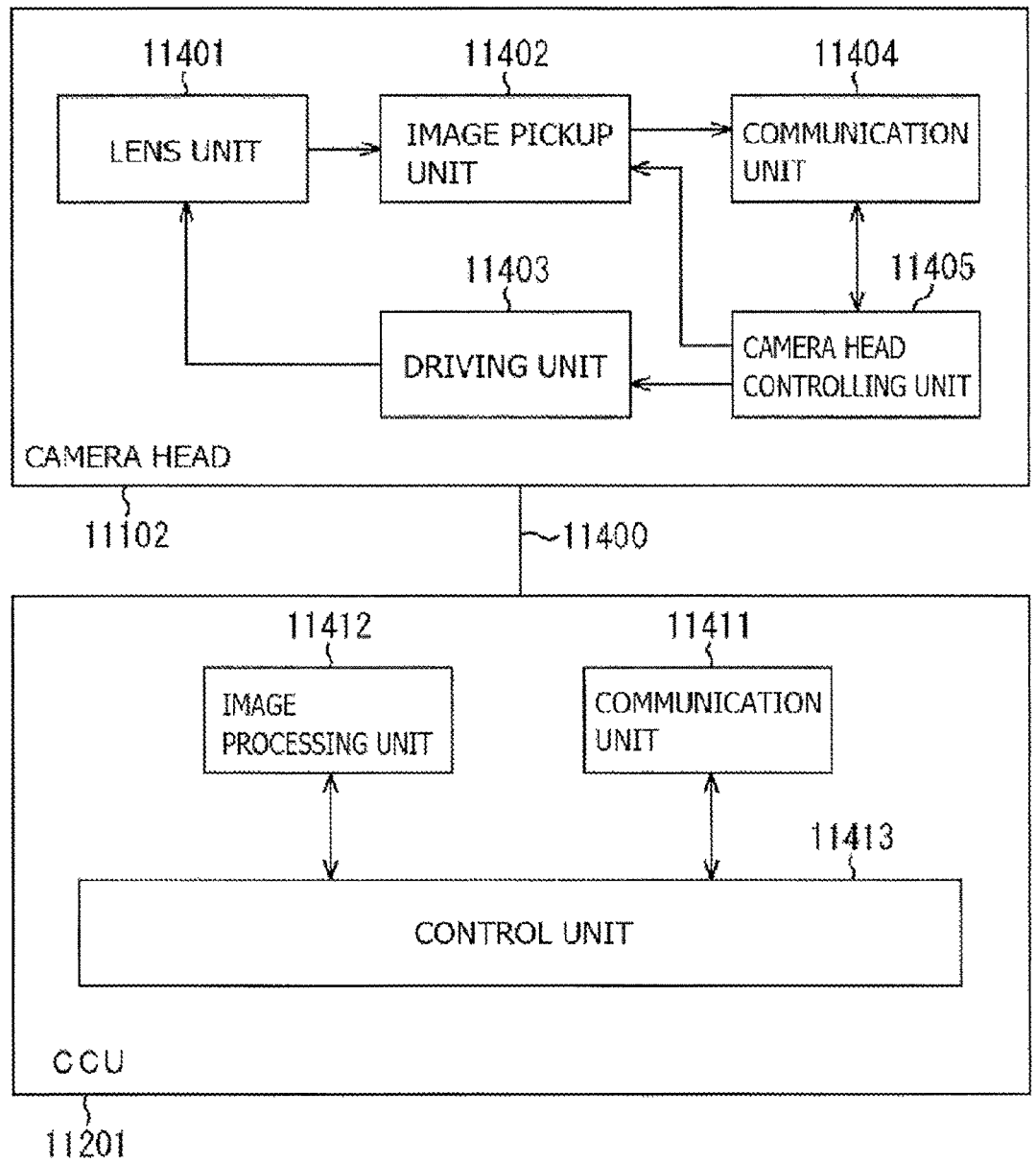

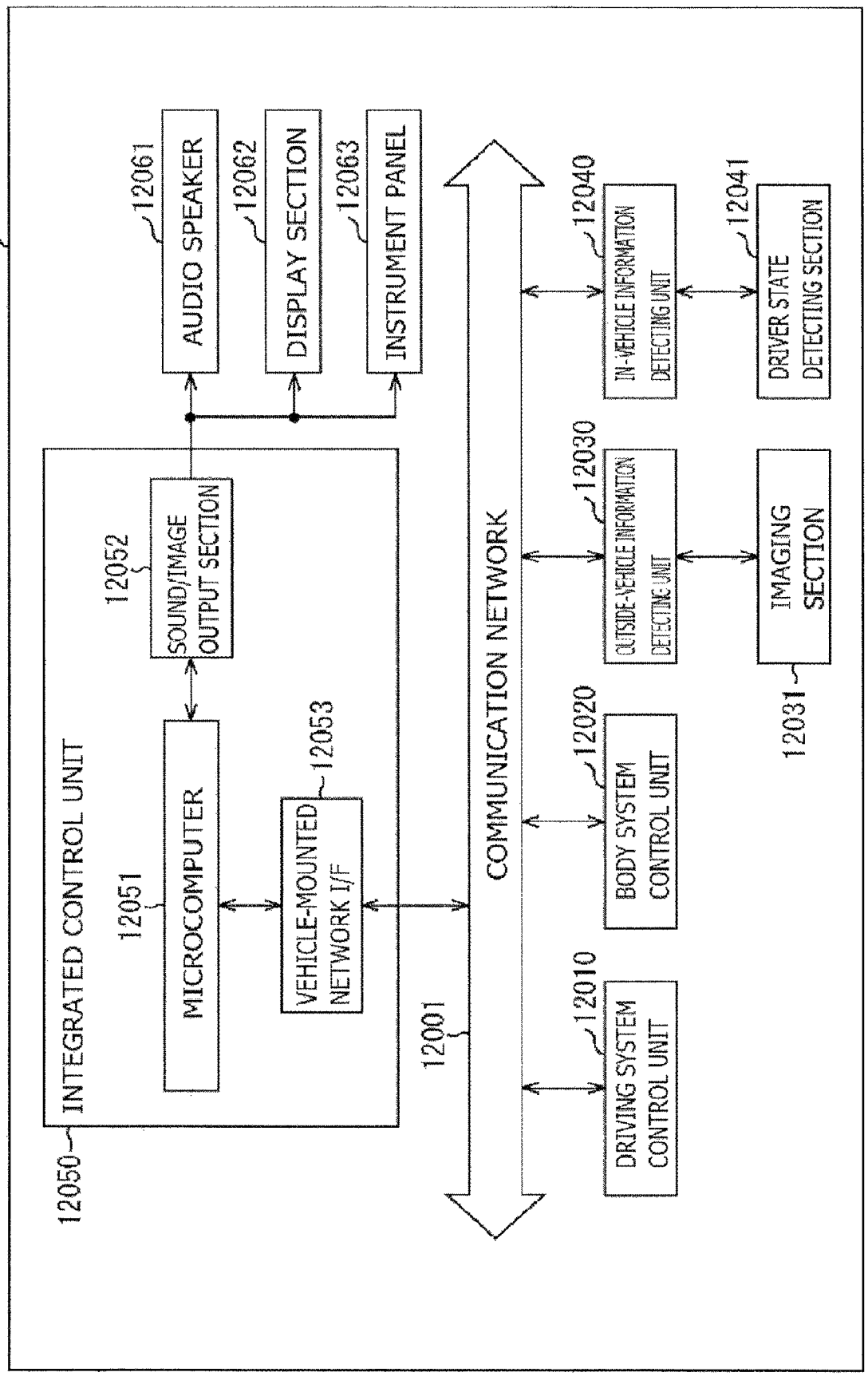

[ FIG. 21 ]
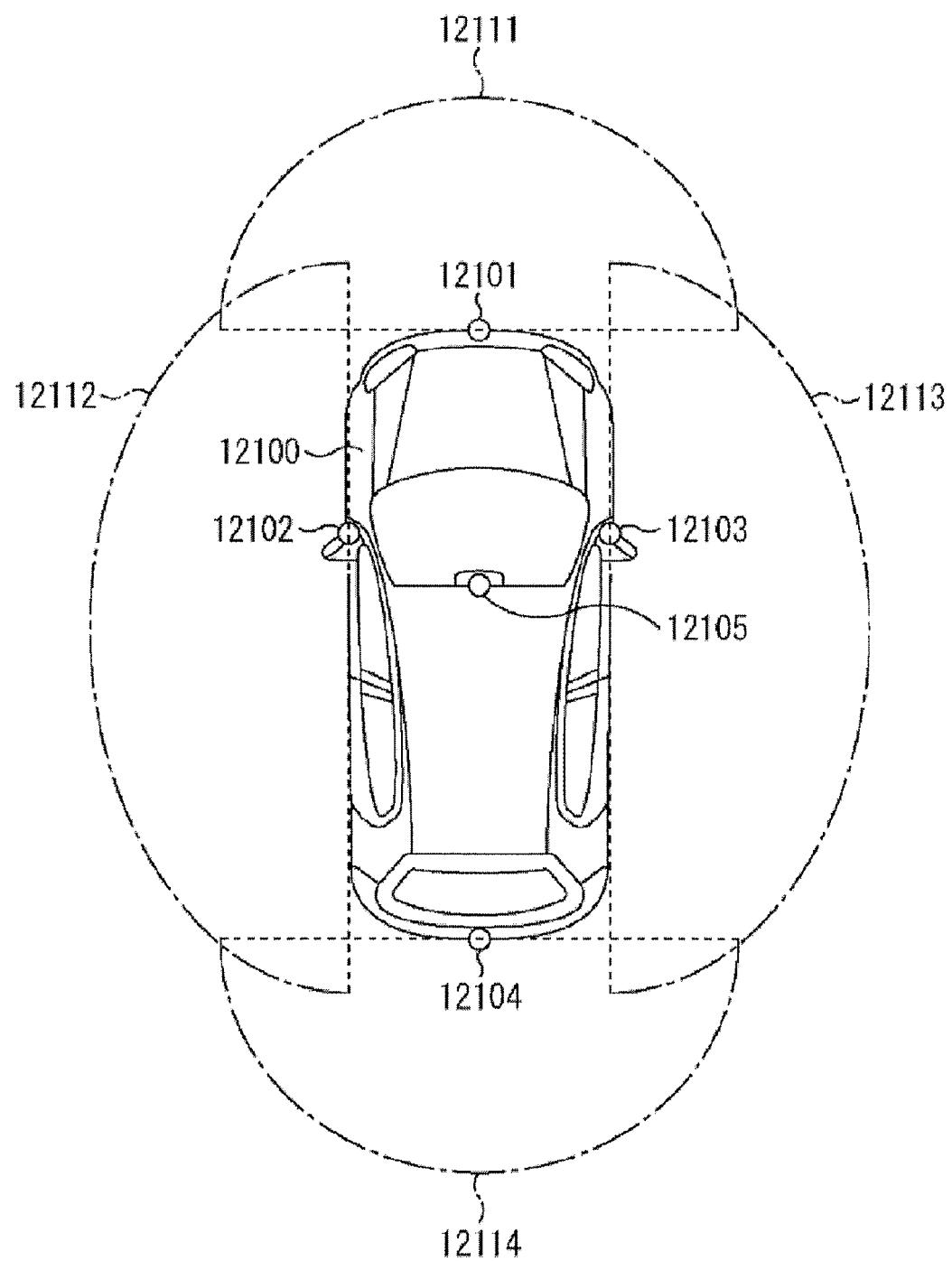

though the first section, and a second section. The first section is closer to the
LIGHT-RECEIVING DEVICE, IMAGING DEVICE, AND ELECTRONIC APPARATUS

CROSS REFERENCE TO RELATED APPLICATIONS

This application is a national stage application under 35 U.S.C. 371 and claims the benefit of PCT Application No. PCT/JP2017/041435 having an international filing date of 17 Nov. 2017, which designated the United States, which PCT application claimed the benefit of Japanese Priority Patent Application 2016-237296 filed on 7 Dec. 2016, the disclosures of each of which are incorporated herein by reference.

TECHNICAL FIELD

The technology relates to a light-receiving device, an imaging device, and an electronic apparatus that may be used for a device such as, but not limited to, an infrared sensor.

BACKGROUND ART

An image sensor having a sensitivity in an infrared region, or an "infrared sensor", has been commercialized in recent years. A light-receiving device used for the infrared sensor has a photoelectric conversion layer that includes a group III-V semiconductor such as indium gallium arsenide (InGaAs). Such a photoelectric conversion layer generates electrical charges through absorption of infrared light, i.e., performs photoelectric conversion. For example, reference is made to PTL 1.

CITATION LIST

Patent Literature

PTL 1: Japanese Unexamined Patent Application Publication No. 2014-127499

SUMMARY

Technical Problem

Various proposals have been made for a device structure of a light-receiving device or an imaging device. What is, however, desired is a further improvement in efficiency of photoelectric conversion.

It is desirable to provide a light-receiving device, an imaging device, and an electronic apparatus that are able to improve efficiency of photoelectric conversion.

Solution to Problem

A light-receiving device according to an embodiment of the present technology includes at least one pixel. The at least one pixel includes a first electrode; a second electrode; and a photoelectric conversion layer between the first electrode and the second electrode. The photoelectric conversion layer is configured to convert incident infrared light into electric charge. The photoelectric conversion layer has a first section and a second section. The first section is closer to the first electrode than the second section, and the second section is closer to the second electrode than the first section. At least one of the first section and the second section have a plurality of surfaces.

An electronic apparatus according to an embodiment of the present technology includes at least one pixel. The at least one pixel includes a first electrode; a second electrode; and a photoelectric conversion layer between the first electrode and the second electrode. The photoelectric conversion layer is configured to convert incident infrared light into electric charge. The photoelectric conversion layer has a first section and a second section. The first section is closer to the first electrode than the second section, and the second section is closer to the second electrode than the first section. At least one of the first section and the second section have a plurality of surfaces.

An imaging device according to an embodiment of the present technology includes at least one pixel. The at least one pixel includes a first electrode, a second electrode, and a photoelectric conversion layer between the first electrode and the second electrode. The photoelectric conversion layer has a first section and a second section. The first section is closer to the first electrode than the second section, and the second section is closer to the second electrode than the first section. At least one of the first section and the second section have a plurality of inclined surfaces that guide incident light toward a central axis of the photoelectric conversion layer.

In the light-receiving device, the imaging device, and the electronic apparatus according to the above-described respective embodiments of the technology, the photoelectric conversion layer has the first facing section (or first section) and the second facing section (or second section), and one or both of the first facing section and the second facing section has the plurality of surfaces. This makes it easier for incident light to be collected inside the photoelectric conversion layer as compared with a configuration in which the first facing section and the second facing section each have a single surface.

Effects of the Invention

According to the light-receiving device, the imaging device, and the electronic apparatus in the above-described respective embodiments of the technology, one or both of the first facing section and the second facing section of the photoelectric conversion layer has the plurality of surfaces. Hence, it is possible to improve the efficiency of the photoelectric conversion. It is to be noted that an effect described above is illustrative and not necessarily limited. An effect to be achieved by an embodiment of the disclosure may be any of effects described in the disclosure. It is to be understood that both the foregoing general description and the following detailed description are exemplary, and are provided to provide further explanation of the technology as claimed.

BRIEF DESCRIPTION OF DRAWINGS

The accompanying drawings are included to provide a further understanding of the technology, and are incorporated in and constitute a part of this specification. The drawings illustrate embodiments and, together with the specification, serve to explain the principles of the technology.

FIG. 1 is a cross-sectional view of a schematic configuration of a light-receiving device according to an embodiment of the technology.

FIG. 2 illustrates a planar configuration of a major part of the light-receiving device illustrated in FIG. 1.

FIG. 3 is a plan view of a configuration of a first-conductivity-type layer illustrated in FIG. 1.

FIG. 4A is a plan view of a configuration of a facing section, which faces a first electrode, of a photoelectric conversion layer illustrated in FIG. 1.

FIG. 4B is a plan view of a configuration of a facing section, which faces a second electrode, of the photoelectric conversion layer illustrated in FIG. 1.

FIG. 5 is a plan view of a configuration of a second-conductivity-type layer illustrated in FIG. 1.

FIG. 6A is a schematic cross-sectional view of a process of a method of manufacturing the light-receiving device illustrated in FIG. 1.

FIG. 6B is a schematic cross-sectional view of a process subsequent to the process illustrated in FIG. 6A.

FIG. 6C is a schematic cross-sectional view of a process subsequent to the process illustrated in FIG. 6B.

FIG. 6D is a schematic cross-sectional view of a process subsequent to the process illustrated in FIG. 6C.

FIG. 7A is a schematic cross-sectional view of a process subsequent to the process illustrated in FIG. 6D.

FIG. 7B is a schematic cross-sectional view of a process subsequent to the process illustrated in FIG. 7A.

FIG. 7C is a schematic cross-sectional view of a process subsequent to the process illustrated in FIG. 7B.

FIG. 7D is a schematic cross-sectional view of a process subsequent to the process illustrated in FIG. 7C.

FIG. 8A is a schematic cross-sectional view of a process subsequent to the process illustrated in FIG. 7D.

FIG. 8B is a schematic cross-sectional view of a process subsequent to the process illustrated in FIG. 8A.

FIG. 9A is a schematic cross-sectional view of a process of a method of manufacturing a light-receiving device according to a comparative example.

FIG. 9B is a schematic cross-sectional view of a process subsequent to the process illustrated in FIG. 9A.

FIG. 10 is a cross-sectional view of a schematic configuration of the light-receiving device manufactured through the processes illustrated in FIGS. 9A and 9B.

FIG. 11A is a cross-sectional view that describes workings, on the second electrode side, of the light-receiving device illustrated in FIG. 1.

FIG. 11B is a cross-sectional view that describes workings, on the first electrode side, of the light-receiving device illustrated in FIG. 1.

FIG. 12 is a cross-sectional view of a schematic configuration of a light-receiving device according to a first modification example.

FIG. 13 is a cross-sectional view of a schematic configuration of a light-receiving device according to a second modification example.

FIG. 14 is a cross-sectional view of a schematic configuration of a light-receiving device according to a third modification example.

FIG. 15 is a block diagram illustrating a configuration of an imaging device that uses a device structure of the light-receiving device illustrated in FIG. 1 or any other drawing.

FIG. 16 schematically illustrates an example of a configuration of a laminate imaging device.

FIG. 17 is a functional block diagram illustrating an example of an electronic apparatus, such as a camera, that uses the imaging device illustrated in FIG. 15.

FIG. 18 is a view depicting an example of a schematic configuration of an endoscopic surgery system.

FIG. 19 is a block diagram depicting an example of a functional configuration of a camera head and a camera control unit (CCU).

FIG. 20 is a block diagram depicting an example of schematic configuration of a vehicle control system.

FIG. 21 is a diagram of assistance in explaining an example of installation positions of an outside-vehicle information detecting section and an imaging section.

DESCRIPTION OF EMBODIMENTS

In the following, some embodiments of the technology are described in detail with reference to the drawings. It is to be noted that description is given in the following order.

1. Embodiment (an example of a light-receiving device in which a first facing section and a second facing section each have a plurality of surfaces)

2. First Modification Example (an example in which the light-receiving device includes pixels having different sizes)

3. Second Modification Example (an example in which the second facing section has the plurality of surfaces)

4. Third Modification Example (an example in which the first facing section has the plurality of surfaces)

5. First Application Example (an example of an imaging device)

6. Second Application Example (an example of an electronic apparatus)

7. First Further Application Example (an example of an endoscopic surgery system)

8. Second Further Application Example (an example of a mobile body control system)

Embodiment (Configuration of Light-Receiving Device 1)

FIG. 1 illustrates a cross-sectional configuration of a light-receiving device, i.e., a light-receiving device 1, according to an embodiment of the technology. FIG. 2 illustrates a planar configuration of a major part of the light-receiving device 1. The light-receiving device 1 may be applied to a device in which a compound semiconductor is used, such as an infrared sensor. The compound semiconductor may be, for example but not limited to, a group III-V semiconductor. The light-receiving device 1 may include a plurality of light-receiving unit regions that are two-dimensionally disposed. The light-receiving unit region is hereinafter referred to as a "pixel P". FIG. 1 illustrates an example of a cross-sectional configuration of a portion corresponding to four pixels P.

The light-receiving device 1 may have a multilayer wiring substrate 10. The light-receiving device 1 may include a first electrode 31, a first-conductivity-type layer 32, a photoelectric conversion layer 33, a second-conductivity-type layer 34, and a second electrode 35 that are provided in this order on the multilayer wiring substrate 10. The first electrode 31, the first-conductivity-type layer 32, the photoelectric conversion layer 33, and the second-conductivity-type layer 34 may be provided separately for each of the pixels P. The second electrode 35 may be provided commonly for the plurality of pixels P.

The light-receiving device 1 may include a protective film 21 provided between the first electrode 31 and the multilayer wiring substrate 10. The protective film 21 may be provided with a through electrode 21E coupled to the first electrode 31. The light-receiving device 1 may include a passivation film 22, an insulating film 23, and a light-blocking film 24 that are provided between the mutually-adjacent pixels P.

The light-receiving device 1 may include an on-chip lens 26 provided on the side on which the second electrode 35 is located. The on-chip lens 26 may be provided for each of the pixels P. The light-receiving device 1 may include an antireflection film 25 provided between the on-chip lens 26 and the second electrode 35.

The multilayer wiring substrate 10 may include a substrate 11 and a multilayer wiring layer 12. The substrate 11 may be, for example but not limited to, a silicon (Si) substrate. The multilayer wiring layer 12 may be provided between the substrate 11 and the protective film 21. The multilayer wiring layer 12 may be provided with a plurality of wiring lines 12W that configure a readout integrated circuit (ROIC). The multilayer wiring layer 12 may be provided with a connection section 12C. The connection section 12C may be located at a position close to the protective film 21, and provided for each of the pixels P. The connection section 12C may be an electrode that includes, for example but not limited to, copper (Cu). The connection section 12C may have one face that is in contact with the through electrode 21E provided in the protective film 21, and that is electrically coupled to any of the wiring lines 12W. In other words, the first electrode 31 may be electrically coupled to the ROIC through the through electrode 21E and the connection section 12C.

The first electrode 31 may be an electrode, or an "anode", to which a voltage directed to reading out of signal charges generated at the photoelectric conversion layer 33 is supplied, and may be provided for each of the pixels P. The signal charges may be holes or electrons. In the following, the signal charges are described as being the holes for description purpose. The first electrode 31 may be in contact with the first-conductivity-type layer 32 at a substantially middle portion of the first-conductivity-type layer 32, and may be so provided in a concave shape as to follow a shape of the first-conductivity-type layer 32. In other words, the first electrode 31 may protrude toward the side on which the multilayer wiring substrate 10 is located. The single first electrode 31 may be disposed for the single pixel P. The first electrodes 31 of the respective mutually-adjacent pixels P may be electrically separated from each other by the protective film 21.

The first electrode 31 may include a simple substance selected from, for example but not limited to, titanium (Ti), tungsten (W), titanium nitride (TiN), platinum (Pt), gold (Au), germanium (Ge), palladium (Pd), zinc (Zn), nickel (Ni), and aluminum (Al). Alternatively, the first electrode 31 may include an alloy that contains one or more of the above-described simple substances. The first electrode 31 may be a single film made of any of the above-described materials configuring the first electrode 31, or may be a laminate film having a combination of two or more of the above-described materials. In one example, the first electrode 31 may be a laminate film that includes a titanium film and a tungsten film. In this example, the films may be so disposed that the titanium film is in contact with the first-conductivity-type layer 32.

The first-conductivity-type layer 32 may be provided between the first electrode 31 and the photoelectric conversion layer 33. The first-conductivity-type layer 32 may be in contact with the photoelectric conversion layer 33 such that the first-conductivity-type layer 32 follows along a shape of the photoelectric conversion layer 33. The single first-conductivity-type layer 32 may be disposed for the single pixel P. The first-conductivity-type layers 32 of the respective mutually-adjacent pixels P may be electrically separated from each other by the passivation film 22 and the insulating film 23. The first-conductivity-type layer 32 may serve as a region in which the signal charges generated at the photoelectric conversion layer 33 migrate, and may include a compound semiconductor that contains, for example but not limited to, a p-type impurity. In one example, the compound semiconductor that configures the first-conductivity-type layer 32 may have a refractive index smaller than a refractive index of a compound semiconductor that configures the photoelectric conversion layer 33. In one example, the first-conductivity-type layer 32 may include indium phosphide (InP) that contains the p-type impurity such as, but not limited to, zinc (Zn). The p-type impurity may have a concentration in a range from $1\times10^{18}$ cm$^{-3}$ to $2\times10^{18}$ cm$^{-3}$ without limitation. The first-conductivity-type layer 32 may have a thickness in a range from 100 nm to 5,000 nm without limitation.

FIG. 3 illustrates a planar shape of the first-conductivity-type layer 32 as viewed from the first electrode 31. The first-conductivity-type layer 32 may have four (111) surfaces (e.g., inclined surfaces) that are in contact with the first electrode 31, for example. The four (111) surfaces each may be triangular in shape without limitation, and may form respective side faces of a quadrangular pyramid having a top on the side on which the first electrode 31 is located. In other words, the four (111) surfaces may be so disposed as to be inclined relative to a surface of the multilayer wiring substrate 10. Note that the term "quadrangular pyramid" described above is used simply for description purpose, and that a bottom surface that configures the quadrangular pyramid is not provided. In an alternative example, the first-conductivity-type layer 32 may have any other three-dimensional shape whose side faces are formed by the four (111) surfaces. The four (111) surfaces may be inclined at an angle of, for example but not limited to, 46.7 degrees relative to the surface of the multilayer wiring substrate 10. Note that any number of surfaces of the first-conductivity-type layer 32 suffices as long as the first-conductivity-type layer 32 are in contact with the first electrode 31 through the plurality of surfaces. In one example, the first-conductivity-type layer 32 may be in contact with the first electrode 31 through two or more (111) surfaces. In an alternative example, the first-conductivity-type layer 32 may be in contact with the first electrode 31 through five or more surfaces. The first-conductivity-type layer 32 may also have four (111) surfaces through which the first-conductivity-type layer 32 is in contact with the photoelectric conversion layer 33, for example.

The photoelectric conversion layer 33 may absorb light of a predetermined wavelength to thereby generate the signal charges, i.e., the electrons or the holes. The light of the predetermined wavelength may be, for example but not limited to, light of a wavelength in an infrared region. The photoelectric conversion layer 33 may include a compound semiconductor such as, but not limited to, a group III-V semiconductor. The single photoelectric conversion layer 33 may be disposed for the single pixel P. The photoelectric conversion layers 33 of the respective mutually-adjacent pixels P may be electrically separated from each other by the insulating film 23.

The photoelectric conversion layer 33 provided between the first electrode 31 and the second electrode 35 may include, for example but not limited to, an i-type group III-V semiconductor. Non-limiting examples of the group III-V semiconductor used for the photoelectric conversion layer 33 may include indium gallium arsenide (InGaAs). A composition of the InGaAs may be, for example but not limited to, $In_xGa_{(1-x)}As$ where x is defined as $0<x\leq1$. In one example, a value of x may be equal to or greater than 0.4 (x≥0.4) in order to increase a sensitivity in the infrared region. The photoelectric conversion layer 33 may have a thickness in a range from 1,000 nm to 5,000 nm without limitation.

FIGS. 4A and 4B each illustrate a planar shape of the photoelectric conversion layer 33. Specifically, FIG. 4A illustrates a planar shape of a facing section that faces the first electrode 31, i.e., a first facing section (or first section) 33A, and FIG. 4B illustrates a planar shape of a facing section that faces the second electrode 35, i.e., a second facing section 33B (or a second section). In the present embodiment, the first facing section 33A and the second facing section 33B of the photoelectric conversion layer 33 each have a plurality of surfaces. This configuration makes it easier for incident light to be collected inside the photoelectric conversion layer 33 and thereby makes it possible to improve efficiency of photoelectric conversion as described later in greater detail.

The first facing section 33A may have four (111) surfaces that are in contact with the first-conductivity-type layer 32, for example. The four (111) surfaces each may be triangular in shape without limitation, and may form respective side faces of a quadrangular pyramid having a top on the side on which the first electrode 31 is located. In other words, the four (111) surfaces may be so disposed as to be inclined relative to the surface of the multilayer wiring substrate 10. The four (111) surfaces may be inclined at an angle of, for example but not limited to, 46.7 degrees relative to the surface of the multilayer wiring substrate 10. Note that the term "quadrangular pyramid" described above is used simply for description purpose, and that a bottom surface that configures the quadrangular pyramid is not provided. In an alternative example, the first facing section 33A may have any other three-dimensional shape whose side faces are formed by the four (111) surfaces. Note that any number of surfaces of the first facing section 33A suffices as long as the first facing section 33A has the plurality of surfaces. In one example, the first facing section 33A may have two or more (111) surfaces, or may have five or more surfaces.

The second facing section 33B may have four (111) surfaces that are in contact with the second-conductivity-type layer 34, for example. The four (111) surfaces each may be triangular in shape without limitation, and may form respective side faces of a quadrangular pyramid having a top on the side on which the first electrode 31 is located. In other words, the four (111) surfaces may be so disposed as to be inclined relative to the surface of the multilayer wiring substrate 10. The four (111) surfaces may be inclined at an angle of, for example but not limited to, 46.7 degrees relative to the surface of the multilayer wiring substrate 10. Note that the term "quadrangular pyramid" described above is used simply for description purpose, and that a bottom surface that configures the quadrangular pyramid is not provided. In an alternative example, the second facing section 33B may have any other three-dimensional shape whose side faces are formed by the four (111) surfaces. Note that any number of surfaces of the second facing section 33B suffices as long as the second facing section 33B has the plurality of surfaces. In one example, the second facing section 33B may have two or more (111) surfaces, or may have five or more surfaces.

The second-conductivity-type layer 34 may be provided between the photoelectric conversion layer 33 and the second electrode 35. The second-conductivity-type layer 34 may be in contact with the photoelectric conversion layer 33 such that the second-conductivity-type layer 34 follows along the second facing section 33B of the photoelectric conversion layer 33. The single second-conductivity-type layer 34 may be disposed for the single pixel P. The second-conductivity-type layers 34 of the respective mutually-adjacent pixels P may be electrically separated from each other by the insulating film 23. The second-conductivity-type layer 34 may serve as a region in which electrical charges discharged from the second electrode 35 migrate, and may include a compound semiconductor that contains, for example but not limited to, an n-type impurity. In one example, the compound semiconductor that configures the second-conductivity-type layer 34 may have a refractive index smaller than the refractive index of the compound semiconductor that configures the photoelectric conversion layer 33. In one example, the second-conductivity-type layer 34 may include indium phosphide (InP) that contains the n-type impurity such as, but not limited to, silicon (Si). The n-type impurity may have a concentration in a range from $1 \times 10^{18}$ cm$^{-3}$ to $2 \times 10^{18}$ cm$^{-3}$ without limitation. The second-conductivity-type layer 34 may have a thickness in a range from 10 nm to 100 nm without limitation.

FIG. 5 illustrates a planar shape of the second-conductivity-type layer 34 as viewed from the second electrode 35. The second-conductivity-type layer 34 may have four (111) surfaces that are in contact with the second electrode 35, for example. The four (111) surfaces each may be triangular in shape without limitation, and may form respective side faces of a quadrangular pyramid having a top on the side on which the first electrode 31 is located. In other words, the four (111) surfaces may be so disposed as to be inclined relative to the surface of the multilayer wiring substrate 10. The four (111) surfaces may be inclined at an angle of, for example but not limited to, 46.7 degrees relative to the surface of the multilayer wiring substrate 10. Note that the term "quadrangular pyramid" described above is used simply for description purpose, and that a bottom surface that configures the quadrangular pyramid is not provided. In an alternative example, the second-conductivity-type layer 34 may have any other three-dimensional shape whose side faces are formed by the four (111) surfaces. Note that any number of surfaces of the second-conductivity-type layer 34 suffices as long as the second-conductivity-type layer 34 is in contact with the second electrode 35 through the plurality of surfaces. In one example, the second-conductivity-type layer 34 may be in contact with the second electrode 35 through two or more (111) surfaces. In an alternative example, the second-conductivity-type layer 34 may be in contact with the second electrode 35 through five or more surfaces. The second-conductivity-type layer 34 may also have four (111) surfaces through which the second-conductivity-type layer 34 is in contact with the photoelectric conversion layer 33, for example.

The second electrode 35 may serve as an electrode common to each of the pixels P, for example. The second electrode 35 may be so provided on the second-conductivity-type layer 34 (i.e., on the light-incident side) as to be in contact with the second-conductivity-type layer 34 at a substantially middle portion of the second-conductivity-type layer 34. The second electrode 35 may be so provided in a concave shape as to follow a shape of the second-conductivity-type layer 34. In other words, the second electrode 35 may protrude toward the side on which the multilayer wiring substrate 10 is located. The second electrode 35 may serve to discharge electrical charges unused as the signal charges among the electrical charges generated at the photoelectric conversion layer 33, i.e., may serve as a cathode. For example, it is possible to discharge the electrons through the second electrode 35 in a case where the holes are to be read out from the first electrode 31 as the signal charges. The second electrode 35 may be an electrically-conductive film that allows for transmission of the incident light such as, but not limited to, infrared light. The second electrode 35 may include indium tin oxide (ITO), titanium-doped indium oxide (ITiO) such as $In_2O_3$—$TiO_2$, or any other material that allows for transmission of light.

The protective film 21 may be so provided as to cover a surface, located on the side on which the multilayer wiring layer 12 is located, of the multilayer wiring substrate 10. The protective film 21 may be made of an inorganic insulating material. Nonlimiting examples of the inorganic insulating material may include silicon nitride (SiN), aluminum oxide ($Al_2O_3$), silicon oxide ($SiO_2$), and hafnium oxide ($HfO_2$). In one example, the protective film 21 may have a stacked structure including: a film that serves as an etching stopper; and any other film, as described later in greater detail. In one example, a configuration may be employed in which the silicon nitride and the silicon oxide are stacked, in consideration of the silicon nitride that serves as the etching stopper. In an alternative example, the aluminum oxide, which is high in interfacial characteristics, may be used for the protective film 21. In such an alternative example, the aluminum oxide, the silicon nitride, and the silicon oxide may be stacked in this order from a position close to the first electrode 31. The through electrode 21E provided in the protective film 21 may serve to allow the connection section 12C and the first electrode 31 to be coupled to each other, and may be provided for each of the pixels P. The through electrode 21E may include, for example but not limited to, copper (Cu).

The passivation film 22 may be provided between the protective film 21 and the insulating film 23, and may cover a portion of a side face of the first-conductivity-type layer 32 provided for each of the pixels P. In other words, the passivation film 22 may cover the portion of the side face of the first-conductivity-type layer 32 which is located on the side on which the first electrode 31 is located. The passivation film 22 may include, for example but not limited to, silicon nitride. The passivation film 22 may have a stacked structure. The passivation film 22 may serve as the above-described etching stopper.

The insulating film 23 may cover another portion of the side surface of the first-conductivity-type layer 32, i.e., may cover a portion uncovered with the passivation film 22 of the first-conductivity-type layer 32. The insulating film 23 may also cover a side face of the photoelectric conversion layer 33 and a side face of the second-conductivity-type layer 34. The insulating film 23 may serve to separate the mutually-adjacent photoelectric conversion layers 33 such that those photoelectric conversion layers 33 are each provided on a pixel P basis. Thus, a region between the mutually-adjacent photoelectric conversion layers 33 may be buried by the insulating film 23. The insulating film 23 may include any oxide such as, but not limited to, silicon oxide ($SiO_x$) and aluminum oxide ($Al_2O_3$). In one example, the insulating film 23 may have a stacked structure that includes the silicon oxide and the aluminum oxide. In such an example, the aluminum oxide may be provided at a position close to the protective film 21. The insulating film 23 may alternatively be made of an insulating material based on silicon (Si), such as, but not limited to, silicon oxynitride (SiON), carbon-containing silicon oxide (SiOC), and silicon carbide (SiC). In one example, such a material that configures the insulating film 23 may be smaller in refractive index than the materials that configure the first-conductivity-type layer 32 and the second-conductivity-type layer 34.

The light-blocking film 24 may be provided between the mutually-adjacent pixels P, and embedded in the insulating film 23, the passivation film 22, and a portion of the protective film 21. Referring to FIG. 2, the light-blocking film 24 may so extend between the pixels P as to form a wall shape, for example. This configuration prevents (or alternatively, mitigates) a migration of the signal charges between the pixels P. This configuration also prevents (or alternatively, mitigates) any adjacent pixel from being influenced by crosstalk attributed to oblique incident light.

The light-blocking film 24 may include a metal such as, but not limited to, titanium (Ti), tungsten (W), platinum (Pt), gold (Au), and chromium oxide ($Cr_2O_3$). Alternatively, the light-blocking film 24 may include an alloy of samarium (Sm) and silver (Ag), or may be made of an organic material. The light-blocking film 24 may be formed with use of carbon (C). The light-blocking film 24 may be a single film or a laminate film. In one example where the light-blocking film 24 is the laminate film, the light-blocking film 24 may be a metallic laminate film that includes, for example but not limited to, a titanium film and a tungsten film (Ti/W).

The antireflection film 25 may be provided on the second electrode 35. For example, the antireflection film 25 may be provided over the entire region of the multilayer wiring substrate 10. The antireflection film 25 may include, for example but not limited to, silicon nitride (SiN), aluminum oxide ($Al_2O_3$), silicon oxide ($SiO_2$), or tantalum oxide ($Ta_2O_3$).

The on-chip lens 26 may have a function of allowing the incident light to be collected toward the photoelectric conversion layer 33, and may be provided on the second electrode 35 with the antireflection film 25 in between. The on-chip lens 26 may be provided on an as-needed basis, and may have any shape without being limited to the shape illustrated in the drawings. In one example where the light-receiving device 1 detects not only the infrared light but also the visible light, the light-receiving device 1 may be further provided with a color filter.

(Method of Manufacturing Light-Receiving Device 1)

The light-receiving device 1 may be manufactured in the following example manner.

FIGS. 6A to 8B illustrate manufacturing processes of the light-receiving device 1 in order of processes.

First, a substrate 51 may be prepared to form an oxide film 52 on the substrate 51. The substrate 51 may include, for example but not limited to, silicon (Si). The oxide film 52 may include, for example but not limited to, silicon oxide ($SiO_2$). It is sufficient for the oxide film 52 to be an insulating film that allows for selectivity for a compound semiconductor layer that is to be formed later by an epitaxial method. Nonlimiting examples of such an insulating film may include carbon-containing silicon oxide (SiOC) and silicon oxynitride (SiON). Alternatively, an insulating film that includes, for example but not limited to, silicon carbide (SiC) may be used instead of the oxide film 52.

Thereafter, referring to FIG. 6A, patterning may be performed on the thus-formed oxide film 52 using methods such as, but not limited to, photolithography and dry etching to thereby form an opening 52a. The plurality of openings 52a may be formed such that those openings 52a are each provided on a pixel P basis. The opening 52a may have portions a1 and a2 that are different from each other in opening width. The portion a2 may serve as an opening portion in which the photoelectric conversion layer 33 is to be formed in a later process. The portion a1 may have an aspect ratio higher than an aspect ratio of the portion a2, and may be formed inside the portion a2 as a trench, a hole, or the like. The aspect ratio of the portion a1 may be, for example but not limited to, 1.5 or higher. The portion a1 may extend from the portion a2 to penetrate through the oxide film 52, and may be thus provided in a portion of the substrate 51, i.e., a portion on the side on which the oxide film 52 is located.

An etching may be performed in advance on a surface of the substrate 51 exposed within the portion a1, using nitrohydrofluoric acid without limitation. The etching with use of the nitrohydrofluoric acid involves strong dependency on a crystal plane orientation of, for example but not limited to, a silicon substrate (in this case, the substrate 51), and involves a significantly low etching rate in a (111) surface direction. Thus, the etching stops at the (111) surface for a surface on which the etching is performed, thereby forming the four (111) surfaces. The four (111) surfaces may form the side faces of the quadrangular pyramid having the top within the substrate 51. In other words, the four (111) surfaces may be so disposed as to be inclined relative to a surface of the substrate 51. The four (111) surfaces may be inclined at an angle of, for example but not limited to, 133.3 degrees (46.7 degrees) relative to the surface of the substrate 51. Note that the term "quadrangular pyramid" is used simply for description purpose, and that a bottom surface that configures the quadrangular pyramid is not provided.

Referring to FIG. 6B, after performing the etching with use of the nitrohydrofluoric acid, a buffer layer 53 that includes the InP without limitation may be formed from the four (111) surfaces of the substrate 51 to the portion a1 of the oxide film 52, using a method such as, but not limited to, a metal organic chemical vapor deposition (MOCVD) and a molecular beam epitaxy (MBE). Growing, in this manner, the buffer layer 53 from the four (111) surfaces that are inclined relative to the surface of the substrate 51 allows for a reduction in fault density of the buffer layer 53. One reason is that, upon the growth in a film-formation direction of a stacking fault that originates from an interface between the inclined (111) surfaces and the buffer layer 53, the stacking fault encounters a wall of the oxide film 52 and thus stops its growth. An upper portion of the buffer layer 53 may form a shape of the quadrangular pyramid having the top on the side on which the portion a2 is located. For example, the buffer layer 53 formed by the InP involves a slow growth rate in the (111) surface direction, thereby allowing the four (111) surfaces that form the side faces of the quadrangular pyramid to be formed in the portion a2.

Referring to FIG. 6C, after the formation of the buffer layer 53 in the portion a1, an unillustrated etching stopper layer, the second-conductivity-type layer 34, the photoelectric conversion layer 33, and the first-conductivity-type layer 32 may be formed continuously in this order in the portion a2. The formation of such compound semiconductor layers may be performed in-situ. In one specific but non-limiting example, the compound semiconductor layers may be formed by first forming InGaAs as the etching stopper layer after the formation of the buffer layer 53. The InGaAs may be formed by changing gases, and may have a thickness in a range from 10 nm to 1,000 nm without limitation. In one example, a type and a concentration of an impurity of the etching stopper layer may be brought into conformity with those of the second-conductivity-type layer 34 in consideration of a profile control. After the etching stopper layer is formed, the second-conductivity-type layer 34, the photoelectric conversion layer 33, and the first-conductivity-type layer 32 may be formed in this order while sequentially changing the gases. Upon the formation, the second-conductivity-type layer 34, the photoelectric conversion layer 33, and the first-conductivity-type layer 32 may be each formed with the four (111) surfaces in a direction of the growth of the corresponding layer. In other words, the second-conductivity-type layer 34 may be formed on the four (111) surfaces of the buffer layer 53, the photoelectric conversion layer 33 may be formed on the four (111) surfaces of the second-conductivity-type layer 34, and the first-conductivity-type layer 32 may be formed on the four (111) surfaces of the photoelectric conversion layer 33. The first-conductivity-type layer 32 may also be formed with the four (111) surfaces in a direction of the growth of the first-conductivity-type layer 32. The (111) surfaces of each of the second-conductivity-type layer 34, the photoelectric conversion layer 33, and the first-conductivity-type layer 32 may form the side faces of the quadrangular pyramid having the top in the direction of the growth.

Referring to FIG. 6D, after the formation of the first-conductivity-type layer 32, the passivation film 22 may be formed on the first-conductivity-type layer 32 and the oxide film 52. Thereafter, an opening may be formed on the passivation film 22 in a region corresponding to a middle portion of the first-conductivity-type layer 32, following which the first electrode 31 may be formed in the opening. Specifically, a film of a material configuring the first electrode 31 may be so formed as to allow the opening to be buried by the film, following which the patterning of the film may be performed using methods such as, but not limited to, photolithography and etching to thereby form the first electrode 31.

Referring to FIG. 7A, the protective film 21 and the through electrode 21E may be formed thereafter. Specifically, the protective film 21 may be formed on the first electrode 31 and the passivation film 22, following which the protective film 21 may be planarized using a method such as, but not limited to, chemical mechanical polishing (CMP). In one example, the protective film 21 may be so formed as to have the stacked structure including: the film that serves as the etching stopper; and any other film. Non-limiting examples of the film that serves as the etching stopper may include a silicon nitride film. In one example where the silicon nitride film is used for the etching stopper, the silicon nitride film may be formed first, following which a film such as, but not limited to, a silicon oxide film may be stacked on the silicon nitride film. Thereafter, a through hole may be formed on the protective film 21 in a region corresponding to a middle portion of the first electrode 31, using methods such as, but not limited to, the photolithography and the dry etching. Thereafter, the through electrode 21E may be formed in the through hole using a method such as, but not limited to, plating. The through electrode 21E may include copper or any other conductor.

Referring to FIG. 7B, the through electrode 21E may be joined to the connection section 12C of the multilayer wiring substrate 10 using a method such as, but not limited to, Cu—Cu bonding. Thereafter, referring to FIG. 7C, the substrate 51 may be thinned by means of a polisher without limitation, following which the thus-thinned substrate 51 and the buffer layer 53 may be removed using a method such as, but not limited to, wet etching. Alternatively, the substrate 51 and the buffer layer 53 may be removed in stages by, for example but not limited to, changing chemicals.

Referring to FIG. 7D, the oxide film 52 may be removed after the removal of the substrate 51 and the buffer layer 53. Upon the removal of the oxide film 52, a chemical having a high etching rate selectivity for the oxide film 52 relative to the passivation film 22, the first-conductivity-type layer 32, the photoelectric conversion layer 33, and the second-conductivity-type layer 34 may be used to allow for a selective removal of only the oxide film 52.

Referring to FIG. 8A, the insulating film 23 and the light-blocking film 24 may be thereafter formed in this order. The insulating film 23 may be planarized in advance using a method such as, but not limited to, the CMP. Thereafter, an opening may be formed on the insulating film 23 in a region corresponding to a middle portion of the second-conductivity-type layer 34. The opening may be formed using methods such as, but not limited to, the photolithography and the dry etching. Alternatively, wet etching may be used instead of the dry etching. Thereafter, referring to FIG. 8B, the second electrode 35 may be formed on the opening and the insulating film 23. Thereafter, an unillustrated contact structure may be formed in a region that surrounds the pixels P. The contact structure may couple the second electrode 35 and the multilayer wiring substrate 10.

Lastly, the antireflection film 25 and the on-chip lens 26 may be formed to complete the light-receiving device 1 illustrated by way of example in FIG. 1.

(Operation of Light-Receiving Device 1)

In the light-receiving device 1, light having entered the photoelectric conversion layer 33 through the on-chip lens 26, the antireflection film 25, the second electrode 35, and the second-conductivity-type layer 34 may be absorbed by the photoelectric conversion layer 33. The light may be, for example but not limited to, the light of the wavelength in the infrared region. The absorption of the light generates a pair of hole and electron in the photoelectric conversion layer 33, i.e., causes the photoelectric conversion of the light. In this state, a potential gradient may be generated in the photoelectric conversion layer 33 when a predetermined voltage is applied to the first electrode 31 without limitation, causing one of the thus-generated electrical charges, e.g., the holes, to migrate to the first-conductivity-type layer 32 as the signal charges and to be collected from the first-conductivity-type layer 32 to the first electrode 31. The thus-collected signal charges may be read out by the ROIC of the multilayer wiring substrate 10.

(Workings and Effects of Light-Receiving Device 1)

The light-receiving device 1 according to the present embodiment includes the photoelectric conversion layer 33 having the first facing section and the second facing section. The first facing section and the second facing section each may have the four (111) surfaces that are inclined relative to the surface of the multilayer wiring substrate 10. Further, the first-conductivity-type layer 32 may have the four (111) surfaces through which the first-conductivity-type layer 32 is in contact with the first electrode 31, and the second-conductivity-type layer 34 may have the four (111) surfaces through which the second-conductivity-type layer 34 is in contact with the second electrode 35. The four (111) surfaces of the first-conductivity-type layer 32 and the four (111) surfaces of the second-conductivity-type layer 34 may also be inclined relative to the surface of the multilayer wiring substrate 10. This makes it easier for the incident light such as the infrared light to be collected inside the photoelectric conversion layer 33 and thereby makes it possible to improve the efficiency of the photoelectric conversion as described below.

FIGS. 9A and 9B each illustrate a process of a method of manufacturing a light-receiving device, i.e., a later-described light-receiving device 100 illustrated in FIG. 10, according to a comparative example. Referring to FIG. 9A, a formation of the light-receiving device according to the comparative example involves, for example, performing the CMP after a photoelectric conversion layer 133A is formed. Thereafter, a first-conductivity-type layer 132A is stacked on a surface of the thus-planarized photoelectric conversion layer 133A. Referring to FIG. 9B, the formation of the light-receiving device according to the comparative example further involves performing the CMP on the photoelectric conversion layer 133A after the buffer layer 53 is formed, and forming a second-conductivity-type layer 134A on a surface of the thus-planarized photoelectric conversion layer 133A.

FIG. 10 illustrates a cross-sectional configuration of the light-receiving device, i.e., the light-receiving device 100, manufactured through the processes illustrated in FIGS. 9A and 9B. The light-receiving device 100 has an interface between the second electrode 35 and the second-conductivity-type layer 134A and an interface between the second-conductivity-type layer 134A and the photoelectric conversion layer 133A. These interfaces are parallel to the surface of the multilayer wiring substrate 10 to allow the light to enter. Hence, the light-receiving device 100 involves both a large variation in refractive index and easier reflection of the light between the second electrode 35 and the second-conductivity-type layer 134A and between the second-conductivity-type layer 134A and the photoelectric conversion layer 133A.

Further, an interface between the photoelectric conversion layer 133A and the first-conductivity-type layer 132A and an interface between the first-conductivity-type layer 132A and the first electrode 31 are parallel to the surface of the multilayer wiring substrate 10 as well. For such a light-receiving device 100, it is necessary to sufficiently increase a thickness of the photoelectric conversion layer 133A, in that the light may not be collected sufficiently inside the photoelectric conversion layer 133A if the thickness of the photoelectric conversion layer 133A is not large enough. The photoelectric conversion layer 133A with smaller thickness may possibly result in easier generation of a dark current as well in a case where the InGaAs, which is small in band gap, is used for the photoelectric conversion layer 133A. Accordingly, it is difficult for the light-receiving device 100 to allow the incident light to be collected inside the photoelectric conversion layer 133A efficiently.

Moreover, the second-conductivity-type layer 134A is in contact with the second electrode 35 through only a single surface. The first-conductivity-type layer 132A is also in contact with the first electrode 31 through only a single surface. Accordingly, it is difficult for the light-receiving device 100 to ensure enough contact area.

In addition, methods including the CMP and the dry etching are utilized to planarize the photoelectric conversion layer 133A. Accordingly, the light-receiving device 100 may possibly involve a crystal defect upon the planarization process.

In contrast, referring to FIG. 11A, an interface between the second electrode 35 and the second-conductivity-type layer 34 and an interface between the second-conductivity-type layer 34 and the photoelectric conversion layer 33 may be inclined relative to the surface of the multilayer wiring substrate 10 in the light-receiving device 1 according to the present embodiment. Thus, the light-receiving device 1 allows the variation in refractive index to be moderate between the second electrode 35 and the second-conductivity-type layer 34 and between the second-conductivity-type layer 34 and the photoelectric conversion layer 33 and makes the reflection of the incident light difficult to occur accordingly, thereby allowing the light to enter the inside of the photoelectric conversion layer 33 easily.

Further, an interface between the photoelectric conversion layer 33 and the first-conductivity-type layer 32 and an interface between the first-conductivity-type layer 32 and the first electrode 31 may also be inclined relative to the surface of the multilayer wiring substrate 10. Referring to FIG. 11B, this configuration allows the light that has entered the interface between the photoelectric conversion layer 33 and the first-conductivity-type layer 32 to be diffracted to the photoelectric conversion layer 33 that is higher in refractive index than the first-conductivity-type layer 32, in a case where the refractive index of the first-conductivity-type layer 32 is smaller than the refractive index of the photoelectric conversion layer 33. In addition, this configuration allows the light that has entered an interface between the photoelectric conversion layer 33 and the insulating film 23 to be reflected to the photoelectric conversion layer 33 in a case where the refractive index of the insulating film 23 is smaller than the refractive index of the photoelectric conversion layer 33. Hence, it is possible to ensure enough optical path length and allow the light to be collected inside the photoelectric conversion layer 33 efficiently even for the photoelectric conversion layer 33 that is small in thickness. It is also possible to make the thickness of the photoelectric conversion layer 33 small even in a case where the InGaAs, which is small in band gap, is used for the photoelectric conversion layer 33.

Accordingly, in the light-receiving device 1 according to the present embodiment, the four (111) surfaces may be provided for each of the first-conductivity-type layer 32, the first and the second facing sections of the photoelectric conversion layer 33, and the second-conductivity-type layer 34. The (111) surfaces of each of them may be inclined relative to the surface of the multilayer wiring substrate 10. This makes it easier for the incident light to be collected inside the photoelectric conversion layer 33. Hence, it is possible to improve the efficiency of the photoelectric conversion.

Moreover, the second-conductivity-type layer 34 may be in contact with the second electrode 35 through the four (111) surfaces, and the first-conductivity-type layer 32 may also be in contact with the first electrode 31 through the four (111) surfaces. This increases the contact area as compared with the light-receiving device 100. Hence, it is possible to reduce a contact resistance and improve transfer characteristics accordingly.

In addition, the light-receiving device 1 eliminates the necessity to provide the process of planarizing the photoelectric conversion layer 33. Hence, it is possible to suppress the generation of the crystal defect.

Furthermore, in the light-receiving device 1, the photoelectric conversion layer 33 may be formed in the opening 52a, provided for each of the pixels P, of the oxide film 52 to allow the pixels P to be separated from each other as illustrated in FIG. 6A. Hence, it is possible to suppress generation of a defect that may possibly occur upon a process of a pixel separation as described below.

In a case where InGaAs is used for a photoelectric conversion layer, a method may be contemplated in which an impurity region is selectively formed by means of, for example, an ion implantation or a selective diffusion of zinc (Zn) or the like to separate pixels. Another method may be to form an opening on an InP substrate by means of dry etching and cause an epitaxial growth of the photoelectric conversion layer to be performed in the opening to separate the pixels, as disclosed in Japanese Unexamined Patent Application Publication No. 2012-244124. However, doping an impurity in a compound semiconductor such as the InGaAs by means of the ion implantation involves a broad p-n junction profile easily, thereby possibly reducing a sensitivity. Doping the impurity may also involve easier generation of a defect resulting from an insufficient activation of the impurity. Further, the method that utilizes the dry etching as described above may involve easier generation of the crystal defect resulting from damage upon processing.

In contrast, in the light-receiving device 1, the photoelectric conversion layer 33 may be formed in the opening 52a, provided for each of the pixels P, of the oxide film 52 to allow the pixels P to be separated from each other. Hence, it is possible to suppress the generation of the defect that may possibly occur upon the process of the pixel separation as described above.

According to the foregoing embodiment, the four (111) surfaces may be provided for each of the first-conductivity-type layer 32, the first and the second facing sections of the photoelectric conversion layer 33, and the second-conductivity-type layer 34. This makes it easier for the incident light to be collected inside the photoelectric conversion layer 33. Hence, it is possible to improve the efficiency of the photoelectric conversion.

In the following, description is given of modification examples and application examples of the foregoing embodiment. Note that the same or equivalent elements in the following description as those of the embodiment described above are denoted with the same reference numerals, and will not be described in detail.

First Modification Example

FIG. 12 illustrates a cross-sectional configuration of a light-receiving device, i.e., a light-receiving device 1A, according to a first modification example. The light-receiving device 1A may have a configuration, workings, and effects that are similar to those of the light-receiving device 1, with an exception that the light-receiving device 1A includes pixels P1 to P3 that are different from each other in size.

The light-receiving device 1A may include the larger pixel P1, the smaller pixel P2, and the pixel P3 that has a size between the pixel P1 and the pixel P2. In an example where the InGaAs is used for the photoelectric conversion layer 33 and the InP is used for the first-conductivity-type layer 32 and the second-conductivity-type layer 34, light in a wavelength range around 0.4 µm to 1.7 µm without limitation is detectable. To perform the detection of such light, the light-receiving device 1A may be provided with the smaller pixel P2 directed to detection of visible light, the larger pixel P1 directed to detection of near-infrared light, and the pixel P3 directed to detection of light in a range therebetween, i.e., in a range from the visible light to the near-infrared light. In one example, the pixel P3 may have a shape of quadrangle whose one side may be in a range from 3.0 µm to 5.0 µm without limitation, the pixel P2 may have a shape of quadrangle whose one side may be in a range from 1.0 µm to 3.0 µm without limitation, and the pixel P1 may have a shape of quadrangle whose one side may be in a range from 5.0 µm to 10.0 µm without limitation.

The light-receiving device 1A may be formed in a manner similar to that of the light-receiving device 1, with an exception that openings 52a (the portions a2) that are different from each other in size are formed on the oxide film 52.

Second Modification Example

FIG. 13 illustrates a cross-sectional configuration of a light-receiving device, i.e., a light-receiving device 1B, according to a second modification example. The light-receiving device 1B may have a configuration, workings, and effects that are similar to those of the light-receiving device 1, with an exception that the first facing section of a photoelectric conversion layer, i.e., a photoelectric conversion layer 43, of the light-receiving device 1B has a single surface to allow a first-conductivity-type layer, i.e., a first-conductivity-type layer 42, to be in contact with the first electrode 31 through the single surface. In other words, an interface between the photoelectric conversion layer 43 and the first-conductivity-type layer 42 may be flat and parallel to the surface of the multilayer wiring substrate 10.

Third Modification Example

FIG. 14 illustrates a cross-sectional configuration of a light-receiving device, i.e., a light-receiving device 1C, according to a third modification example. The light-receiving device 1C may have a configuration, workings, and effects that are similar to those of the light-receiving device 1, with an exception that the second facing section of a photoelectric conversion layer, i.e., a photoelectric conversion layer 43A, of the light-receiving device 1C has a single surface to allow a second-conductivity-type layer, i.e., a second-conductivity-type layer 44, to be in contact with the second electrode 35 through the single surface. In other words, an interface between the photoelectric conversion layer 43A and the second-conductivity-type layer 44 may be flat and parallel to the surface of the multilayer wiring substrate 10.

First Application Example

FIG. 15 illustrates a functional configuration of an imaging device 2 that uses the device structure of any of the light-receiving devices 1, 1A, 1B, and 1C (hereinafter collectively referred to as the "light-receiving device 1") described in the foregoing embodiment and the modification examples. The imaging device 2 may be, for example but not limited to, an infrared image sensor, and may include a pixel section 10P and a circuit section 20, for example. The pixel section 10P may include the light-receiving device 1, and the circuit section 20 may drive the pixel section 10P. For example, the circuit section 20 may include a row scanning section 131, a horizontal selection section 133, a column scanning section 134, and a system controller 132.

The pixel section 10P may include a plurality of pixels P, i.e., the plurality of light-receiving devices 1, that are two-dimensionally arranged in rows and columns, for example. The pixels P may have a configuration in which, for example, a pixel driving line Lread (such as a row selecting line and a reset control line) is wired for each pixel row and a vertical signal line Lsig is wired for each pixel column. The pixel driving line Lread may transmit a drive signal directed to reading, from any pixel P, of a signal. The pixel driving line Lread may have one end coupled to corresponding one of output terminals, corresponding to the respective rows, of the row scanning section 131.

The row scanning section 131 may include a component such as, but not limited to, a shift register and an address decoder. For example, the row scanning section 131 may be a pixel driver that drives the pixels P of the pixel section 10P on a row basis. Signals outputted from the respective pixels P in the pixel row scanned and selected by the row scanning section 131 may be supplied to the horizontal selection section 133 through the respective vertical signal lines Lsig. The horizontal selection section 133 may include components such as, but not limited to, an amplifier and a horizontal selection switch provided for each of the vertical signal lines Lsig.

The column scanning section 134 may include a component such as, but not limited to, a shift register and an address decoder, and may drive the horizontal selection switches of the horizontal selection section 133 in order while sequentially performing scanning of those horizontal selection switches. Such selection and scanning performed by the column scanning section 134 may allow the signals of the pixels P transmitted through the respective vertical signal lines Lsig to be sequentially outputted to a horizontal signal line 135. The thus-outputted signals may be supplied to an unillustrated signal processor or the like through the horizontal signal line 135.

Referring to FIG. 16, the imaging device 2 may have a configuration in which a substrate 2A having the pixel section 10P and a substrate 2B having the circuit section 20 are stacked, for example. The imaging device 2, however, is not limited to such a configuration. For example, the circuit section 20 may be provided on the same substrate as the pixel section 10P, or may be disposed in an external control IC. Alternatively, the circuit section 20 may be provided in any other substrate coupled by means of a cable or any other coupler.

The system controller 132 may receive a clock provided from outside, data that instructs an operation mode, and so forth. The system controller 132 may also output data such as internal information of the imaging device 2. The system controller 132 may include a timing generator that generates various timing signals to thereby control, on the basis of the various timing signals generated by the timing generator, driving of circuits such as the row scanning section 131, the horizontal selection section 133, and the column scanning section 134.

Second Application Example

The imaging device 2 as described above is applicable to various types of electronic apparatuses such as, but not limited to, a camera that allows for imaging of an infrared region. FIG. 17 illustrates a schematic configuration of an electronic apparatus 3, i.e., a camera, as a non-limiting example of such electronic apparatuses. The electronic apparatus 3 may be a camera that allows for shooting of a still image, a moving image, or both, for example. The electronic apparatus 3 may include the imaging device 2, an optical system (e.g., an optical lens) 310, a shutter unit 311, a driver 313, and a signal processor 312. The driver 313 may drive the shutter unit 311.

The optical system 310 may guide image light (i.e., incident light) obtained from an object to the imaging device 2. The optical system 310 may include a plurality of optical lenses. The shutter unit 311 may control a period in which the imaging device 2 is irradiated with the light and a period in which the light is blocked. The driver 313 may control a transfer operation of the imaging device 2 and a shutter operation of the shutter unit 311. The signal processor 312 may perform various signal processes on the signal outputted from the imaging device 2. A picture signal Dout having been subjected to the signal processes may be stored in a storage medium such as a memory, or outputted to a unit such as a monitor.

The light-receiving device 1 described by referring to the foregoing embodiment, the modification examples, and the application examples is also applicable to the following non-limiting electronic apparatuses, including a capsule endoscope and a mobile body. The mobile body may be, for example but not limited to, a vehicle.

First Further Application Example (Endoscopic Surgery System)

The technique according to any of the foregoing embodiment, the modification examples, and the application examples of the disclosure is applicable to various products. For example, the technique according to any of the foregoing embodiment, the modification examples, and the application examples of the disclosure may be applied to an endoscopic surgery system.

FIG. 18 is a view depicting an example of a schematic configuration of an endoscopic surgery system to which the technology according to an embodiment of the present disclosure (present technology) can be applied.

In FIG. 18, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope 11100 may otherwise be included as a soft minor having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view minor or may be a perspective view minor or a side view mirror.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 19 is a block diagram depicting an example of a functional configuration of the camera head 11102 and the CCU 11201 depicted in FIG. 18.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

In the foregoing, the description has been given of one example of the endoscopic surgery system to which the technology according to an embodiment of the present disclosure can be applied. The technology according to an embodiment of the present disclosure may be applied to the image pickup unit 11402 among the components of the configuration described above. Applying the technology according to an embodiment of the present disclosure to the image pickup unit 11402 makes it possible to obtain a clearer image of the surgical region. Hence, it is possible for the surgeon to confirm the surgical region with certainty.

Note that the description has been given above of the endoscopic surgery system as one example. The technology according to an embodiment of the present disclosure may be applied to any medical system besides the endoscopic surgery system, such as, but not limited to, a micrographic surgery system.

Second Further Application Example (Mobile Body)

The technology according to any of the foregoing embodiment, the modification examples, and the application examples of the disclosure is applicable to various products. For example, the technology according to any of the foregoing embodiment, the modification examples, and the application examples of the disclosure may be achieved in the form of an apparatus to be mounted to a mobile body of any kind. Nonlimiting examples of the mobile body may include an automobile, an electric vehicle, a hybrid electric vehicle, a motorcycle, a bicycle, a personal mobility, an airplane, an unmanned aerial vehicle (drone), a vessel, and a robot.

FIG. 20 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 20, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent (or alternatively, reduce) a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 20, an audio speaker 12061, a display section 12062, and an instrument panel 12063 are illustrated as the output device. The display section 12062 may, for example, include at least one of an on-board display and a head-up display.

FIG. 21 is a diagram depicting an example of the installation position of the imaging section 12031.

In FIG. 21, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 21 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the foregoing, the description has been given of one example of the vehicle control system to which the technology according to an embodiment of the present disclosure can be applied. The technology according to an embodiment of the present disclosure may be applied to the imaging section 12031 among the components of the configuration described above. Applying the technology according to an embodiment of the present disclosure to the imaging section

12031 makes it possible to obtain a captured image which is easier to see. Hence, it is possible to reduce the fatigue of the driver.

Although the description has been given by referring to the embodiment, the modification examples, and the application examples, the contents of the disclosure are not limited to the embodiment, the modification examples, and the application examples, and may be modified in a variety of ways. For example, the layer configuration of the light-receiving device described in the foregoing embodiment is illustrative, and may further include any other layer. The materials and thicknesses of the respective layers are also illustrative and are not limited to those described above.

For example, the embodiment, the modification examples, and the application examples have been described by referring to an example in which the first electrode 31 and the first-conductivity-type layer 32 (or the first-conductivity-type layer 42) are in contact with each other and the second-conductivity-type layer 34 (or the second-conductivity-type layer 44) and the second electrode 35 are in contact with each other. In an alternative example, any other layer may be provided between the first electrode 31 and the first-conductivity-type layer 32 and/or between the second-conductivity-type layer 34 and the second electrode 35.

In addition, the embodiment, the modification examples, and the application examples have been described by referring to an example in which any of the photoelectric conversion layers 33, 43, and 43A includes the compound semiconductor. In an alternative example, the photoelectric conversion layer 33 may be made of a material other than the compound semiconductor. A material configuring the photoelectric conversion layer 33 according to such an alternative example may be, for example but not limited to, germanium (Ge).

Further, the embodiment, the modification examples, and the application examples have been described by referring to an example in which the signal charges the holes for description purpose. In an alternative example, the signal charges may be the electrons. In such an alternative example, the first-conductivity-type layer 32 (or the first-conductivity-type layer 42) may include the compound semiconductor that contain, for example but not limited to, the n-type impurity, and the first electrode 31 may serve as the cathode. In such an alternative example, the second-conductivity-type layer 34 (or the second-conductivity-type layer 44) may include the compound semiconductor that contain, for example but not limited to, the p-type impurity, and the second electrode 35 may serve as the anode.

It is to be noted that the effects described in the embodiment, the modification examples, and the application examples are illustrative and non-limiting. Effects to be achieved by the disclosure may be effects that are other than those described above, or may further include other effects in addition to those described above.

It is possible to achieve at least the following configurations from the above-described embodiment, the modification examples, and the application examples of the disclosure.

(1)

A light-receiving device comprising:
at least one pixel, the at least one pixel including:
a first electrode;
a second electrode; and
a photoelectric conversion layer between the first electrode and the second electrode, the photoelectric conversion layer configured to convert incident infrared light into electric charge, the photoelectric conversion layer having a first section and a second section, the first section being closer to the first electrode than the second section, the second section being closer to the second electrode than the first section, at least one of the first section and the second section having a plurality of surfaces.

(2)

The light-receiving device according to (1), wherein the plurality of surfaces of at least one of the first section and the second section comprise four or more surfaces that are angled.

(3)

The light-receiving device according to (1), wherein the plurality of surfaces of at least one of the first section and the second section comprise four (111) surfaces.

(4)

The light-receiving device according to (1), wherein both of the first section and the second section have the plurality of surfaces, and wherein the plurality of surfaces for each section comprise four (111) surfaces.

(5)

The light-receiving device according to (4), wherein
the four (111) surfaces of the first section form respective side faces of a first quadrangular pyramid that has a top on which the first electrode is located,
the four (111) surfaces of the second section form respective side faces of a second quadrangular pyramid that has a top on which the photoelectric conversion layer is located, and
incident infrared light enters the photoelectric conversion layer from a side on which the second electrode is located.

(6)

The light-receiving device according to (1), wherein the at least one pixel further includes:
a first-conductivity-type layer between the photoelectric conversion layer and the first electrode, and in contact with the photoelectric conversion layer along the first section of the photoelectric conversion layer; and
a second-conductivity-type layer between the photoelectric conversion layer and the second electrode, and in contact with the photoelectric conversion layer along the second section of the photoelectric conversion layer.

(7)

The light-receiving device according to (6), wherein
the first-conductivity-type layer has a first set of four or more surfaces that contact the first electrode, at least one of the first set of four or more surfaces comprising a (111) surface, and
the second-conductivity-type layer has a second set of four or more surfaces that contact the second electrode, at least one of the second set of four or more surfaces comprising a (111) surface.

(8)

The light-receiving device according to (6), wherein the photoelectric conversion layer includes a compound semiconductor.

(9)

The light-receiving device according to (1), wherein the first electrode includes a portion that conforms to a shape of the first section and the second electrode includes a portion that conforms to a shape of the second section.

(10)

The light-receiving device according to (9), wherein the shape of the first section is one of a quadrangular pyramid or flat, and wherein the shape of the second section is one of a quadrangular pyramid or flat.

(11)
The light-receiving device according to (6), wherein the first-conductivity-type layer and the second-conductivity-type layer each include a material that has a refractive index smaller than a refractive index of a material included in the photoelectric conversion layer.

(12)
The light-receiving device according to (10), wherein the first-conductivity-type layer and the second-conductivity-type layer each include indium phosphide (InP).

(13)
The light-receiving device according to (6), further comprising:
an insulating film, wherein
the at least one pixel comprises a plurality of pixels, and
the photoelectric conversion layers of the respective pixels are separated from each other by the insulating film.

(14)
The light-receiving device according to (13), wherein the insulating film has a refractive index smaller than a refractive index of each of the first-conductivity-type layer and the second-conductivity-type layer.

(15)
The light-receiving device according to (13), further comprising a light-blocking film provided between the pixels that are adjacent to each other.

(16)
The light-receiving device according to (13), wherein
the first electrode is provided for each of the pixels, and
the second electrode is provided commonly for the plurality of pixels.

(17)
The light-receiving device according to (1), wherein
the at least one pixel is a plurality of pixels, and
a first photoelectric conversion layer for a first pixel in the plurality of pixels is sized differently than a second photoelectric conversion layer for a second pixel in the plurality of pixels.

(18)
The light-receiving device according to (17), wherein the first photoelectric conversion layer for the first pixel is larger than the second photoelectric conversion layer for the second pixel, and wherein the first pixel detects infrared light and the second pixel detects visible light.

(19)
An electronic apparatus comprising:
at least one pixel, the at least one pixel including:
a first electrode;
a second electrode; and
a photoelectric conversion layer between the first electrode and the second electrode, the photoelectric conversion layer configured to convert incident infrared light into electric charge, the photoelectric conversion layer having a first section and a second section, the first section being closer to the first electrode than the second section, the second section being closer to the second electrode than the first section, at least one of the first section and the second section having a plurality of surfaces.

(20)
An imaging device, comprising:
at least one pixel, including:
a first electrode,
a second electrode, and
a photoelectric conversion layer between the first electrode and the second electrode, the photoelectric conversion layer having a first section and a second section, the first section being closer to the first electrode than the second section, the second section being closer to the second electrode than the first section, at least one of the first section and the second section having a plurality of inclined surfaces that guide incident light toward a central axis of the photoelectric conversion layer.

(21)
A light-receiving device including
a pixel, the pixel including
a first electrode,
a second electrode, and
a photoelectric conversion layer provided between the first electrode and the second electrode, and having a first facing section that faces the first electrode and a second facing section that faces the second electrode, one or both of the first facing section and the second facing section having a plurality of surfaces.

(22)
The light-receiving device according to (21), in which the plurality of surfaces of one or both of the first facing section and the second facing section include four or more surfaces.

(23)
The light-receiving device according to (21) or (22), in which the plurality of surfaces of one or both of the first facing section and the second facing section include four (111) surfaces.

(24)
The light-receiving device according to any one of (21) to (23), in which the plurality of surfaces of both of the first facing section and the second facing section include four (111) surfaces.

(25)
The light-receiving device according to (24), in which
the four (111) surfaces of the first facing section form respective side faces of a quadrangular pyramid that has a top on side on which the first electrode is located,
the four (111) surfaces of the second facing section form respective side faces of a quadrangular pyramid that has a top on the side on which the first electrode is located, and
the light-receiving device allows light to enter from the side on which the second electrode is located.

(26)
The light-receiving device according to any one of (21) to (25), wherein the pixel further includes:
a first-conductivity-type layer that is provided between the photoelectric conversion layer and the first electrode, and in contact with the photoelectric conversion layer along the first facing section of the photoelectric conversion layer; and
a second-conductivity-type layer that is provided between the photoelectric conversion layer and the second electrode, and in contact with the photoelectric conversion layer along the second facing section of the photoelectric conversion layer.

(27)
The light-receiving device according to (26), in which
the first-conductivity-type layer has four or more surfaces through which the first-conductivity-type layer is in contact with the first electrode, at least one of the four or more surfaces including a (111) surface, and the second-conductivity-type layer has four or more surfaces through which the second-conductivity-type layer is in contact with the second electrode, at least one of the four or more surfaces including a (111) surface.

(28)
The light-receiving device according to (26) or (27), in which the photoelectric conversion layer includes a compound semiconductor.

(29)
The light-receiving device according to (28), in which the compound semiconductor of the photoelectric conversion layer includes a group III-V semiconductor.

(30)
The light-receiving device according to (29), in which the group III-V semiconductor includes indium gallium arsenide (InGaAs).

(31)
The light-receiving device according to any one of (26) to (30), in which the first-conductivity-type layer and the second-conductivity-type layer each include a material that has a refractive index smaller than a refractive index of a material included in the photoelectric conversion layer.

(32)
The light-receiving device according to any one of (26) to (31), in which the first-conductivity-type layer and the second-conductivity-type layer each include indium phosphide (InP).

(33)
The light-receiving device according to any one of (26) to (32), further including an insulating film, in which
the pixel includes a plurality of pixels, and
the photoelectric conversion layers of the respective pixels are separated from each other by the insulating film.

(34)
The light-receiving device according to (33), in which the insulating film has a refractive index smaller than a refractive index of each of the first-conductivity-type layer and the second-conductivity-type layer.

(35)
The light-receiving device according to (33) or (34), further including a light-blocking film provided between the pixels that are adjacent to each other.

(36)
The light-receiving device according to any one of (33) to (35), in which
the first electrode is provided for each of the pixels, and
the second electrode is provided commonly for the plurality of pixels.

(37)
An imaging device including
a pixel, the pixel including
a first electrode,
a second electrode, and
a photoelectric conversion layer provided between the first electrode and the second electrode, and having a first facing section that faces the first electrode and a second facing section that faces the second electrode, one or both of the first facing section and the second facing section having a plurality of surfaces.

(38)
An electronic apparatus that includes an imaging device, the imaging device including
a pixel, the pixel including
a first electrode,
a second electrode, and
a photoelectric conversion layer provided between the first electrode and the second electrode, and having a first facing section that faces the first electrode and a second facing section that faces the second electrode, one or both of the first facing section and the second facing section having a plurality of surfaces.

It should be understood by those skilled in the art that various modifications, combinations, sub-combinations and alterations may occur depending on design requirements and other factors insofar as they are within the scope of the appended claims or the equivalents thereof.

The invention claimed is:
1. A light-receiving device comprising:
a plurality of pixels, each pixel including:
a first electrode;
a second electrode;
a photoelectric conversion layer between the first electrode and the second electrode, the photoelectric conversion layer configured to convert incident light into electric charge, the photoelectric conversion layer having a first section and a second section, the first section being closer to the first electrode than the second section, the second section being closer to the second electrode than the first section, at least one of the first section or the second section having a plurality of surfaces;
a first-conductivity-type layer between the photoelectric conversion layer and the second electrode, the first-conductivity-type layer being in contact with the photoelectric conversion layer along the second section of the photoelectric conversion layer; and
a second-conductivity-type layer between the photoelectric conversion layer and the first electrode, and in contact with the photoelectric conversion layer along the first section of the photoelectric conversion layer,
wherein the photoelectric conversion layer includes a compound semiconductor,
wherein the first-conductivity-type layer has a first set of four or more surfaces that each physically contact the second electrode at a location that overlaps with the photoelectric conversion layer in a plan view,
wherein the incident light enters the photoelectric conversion layer through the second electrode,
wherein each first electrode is electrically isolated from other first electrodes such that each first electrode is provided separately for each pixel, and
wherein the second electrode comprises a contiguous material that spans over the plurality of pixels such that the second electrode is provided commonly for the plurality of pixels.

2. The light-receiving device according to claim 1, wherein the plurality of surfaces of comprise four or more surfaces that are angled.

3. The light-receiving device according to claim 1, wherein the plurality of surfaces comprise four surfaces.

4. The light-receiving device according to claim 1, wherein both of the first section and the second section have the plurality of surfaces, and wherein the plurality of surfaces for each section comprise four surfaces.

5. The light-receiving device according to claim 4, wherein
the four surfaces of the first section form respective side faces of a first quadrangular pyramid that has a top on which the first electrode is located, and the four surfaces of the second section form respective side faces of a second quadrangular pyramid that has a top on which the photoelectric conversion layer is located.

6. The light-receiving device according to claim 1, wherein
the second-conductivity-type layer has a second set of four or more surfaces that each physically contact the first electrode at a location that overlaps with the photoelectric conversion layer in the plan view.

7. The light-receiving device according to claim 1, wherein the first electrode includes a portion that conforms to a shape of the first section and the second electrode includes a portion that conforms to a shape of the second section.

8. The light-receiving device according to claim 7, wherein the shape of the first section is one of a quadrangular pyramid or flat, and wherein the shape of the second section is a quadrangular pyramid.

9. The light-receiving device according to claim 1, wherein the first-conductivity-type layer and the second-conductivity-type layer each include a material that has a refractive index smaller than a refractive index of a material included in the photoelectric conversion layer.

10. The light-receiving device according to claim 8, wherein the first-conductivity-type layer and the second-conductivity-type layer each include indium phosphide (InP).

11. The light-receiving device according to claim 1, further comprising:
a first insulating film, wherein the photoelectric conversion layers of the plurality of pixels are separated from each other by the first insulating film.

12. The light-receiving device according to claim 11, wherein the first insulating film has a refractive index smaller than a refractive index of each of the first-conductivity-type layer and the second-conductivity-type layer.

13. The light-receiving device according to claim 11, further comprising a light-blocking film provided between pixels in the plurality of pixels that are adjacent to each other.

14. The light-receiving device according to claim 11, further comprising:
a second insulating film that isolates the first electrodes of the plurality of pixels from one another.

15. The light-receiving device according to claim 1, wherein
the photoelectric conversion layer for a first pixel in the plurality of pixels is sized differently than the photoelectric conversion layer for a second pixel in the plurality of pixels.

16. The light-receiving device according to claim 15, wherein the photoelectric conversion layer for the first pixel is larger than the photoelectric conversion layer for the second pixel, and wherein the first pixel detects infrared light and the second pixel detects visible light.

17. An electronic apparatus comprising:
a plurality of pixels, each pixel including:
a first electrode;
a second electrode; and
a photoelectric conversion layer between the first electrode and the second electrode, the photoelectric conversion layer configured to convert incident light into electric charge, the photoelectric conversion layer having a first section and a second section, the first section being closer to the first electrode than the second section, the second section being closer to the second electrode than the first section, at least one of the first section or the second section having a plurality of surfaces;
a first-conductivity-type layer between the photoelectric conversion layer and the first electrode, and in contact with the photoelectric conversion layer along the first section of the photoelectric conversion layer; and
a second-conductivity-type layer between the photoelectric conversion layer and the second electrode, and in contact with the photoelectric conversion layer along the second section of the photoelectric conversion layer;
an insulating film, wherein the photoelectric conversion layers of the plurality of pixels are separated from each other by the insulating film; and
a light-blocking film provided between pixels in the plurality of pixels that are adjacent to each other,
wherein the first-conductivity-type layer and the second-conductivity-type layer each include indium phosphide (InP),
wherein the second-conductivity-type layer has a first set of four or more surfaces that each physically contact the second electrode at a location that overlaps with the photoelectric conversion layer in a plan view,
wherein the incident light enters the photoelectric conversion layer through the second electrode,
wherein each first electrode is electrically isolated from other first electrodes such that each first electrode is provided separately for each pixel, and
wherein the second electrode comprises a contiguous material that spans over the plurality of pixels such that the second electrode is provided commonly for the plurality of pixels.

18. An imaging device, comprising:
a plurality of pixels, each pixel including:
a first electrode;
a second electrode;
a photoelectric conversion layer between the first electrode and the second electrode, the photoelectric conversion layer having a first section and a second section, the first section being closer to the first electrode than the second section, the second section being closer to the second electrode than the first section, at least one of the first section or the second section having a plurality of inclined surfaces that guide incident light toward a central axis of the photoelectric conversion layer;
a first-conductivity-type layer between the photoelectric conversion layer and the second electrode, the first-conductivity-type layer being in contact with the photoelectric conversion layer along the second section of the photoelectric conversion layer; and
a second-conductivity-type layer between the photoelectric conversion layer and the first electrode, and in contact with the photoelectric conversion layer along the first section of the photoelectric conversion layer,
wherein the photoelectric conversion layer includes a compound semiconductor,
wherein the first-conductivity-type layer has a first set of four or more surfaces that each physically contact the second electrode at a location that overlaps with the photoelectric conversion layer in a plan view,
wherein the incident light enters the photoelectric conversion layer through the second electrode, wherein each first electrode is electrically isolated from other first electrodes such that each first electrode is provided separately for each pixel, and wherein the second electrode comprises a contiguous material that spans over the plurality of pixels such that the second electrode is provided commonly for the plurality of pixels.

\* \* \* \* \*